(12) United States Patent
Kaiya et al.

(10) Patent No.: US 10,209,319 B2
(45) Date of Patent: Feb. 19, 2019

(54) STATE OF DETERIORATION OR STATE OF CHARGES ESTIMATING APPARATUS FOR SECONDARY BATTERY

(71) Applicant: TOYOTA JIDOSHA KABUSHIKI KAISHA, Toyota-shi, Aichi (JP)

(72) Inventors: Hiroyuki Kaiya, Toyota (JP); Kenji Takahashi, Toyota (JP); Yuji Nishi, Nagoya (JP); Hiroki Tashiro, Aichi (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 295 days.

(21) Appl. No.: 14/758,890

(22) PCT Filed: Feb. 1, 2013

(86) PCT No.: PCT/JP2013/000581
§ 371 (c)(1),
(2) Date: Jul. 1, 2015

(87) PCT Pub. No.: WO2014/118824
PCT Pub. Date: Aug. 7, 2014

(65) Prior Publication Data
US 2015/0338468 A1 Nov. 26, 2015

(51) Int. Cl.
*G01R 31/36* (2006.01)
*H02J 7/00* (2006.01)
*H01M 10/48* (2006.01)

(52) U.S. Cl.
CPC ..... *G01R 31/3679* (2013.01); *G01R 31/3606* (2013.01); *G01R 31/3648* (2013.01); *H02J 7/00* (2013.01); *H01M 10/486* (2013.01)

(58) Field of Classification Search
CPC .................................................. G01R 31/3679
(Continued)

(56) References Cited

U.S. PATENT DOCUMENTS

| 6,600,293 B2 * | 7/2003 | Kikuchi | G01R 31/3679 320/131 |
| 8,018,203 B2 * | 9/2011 | Nishi | B60K 6/365 320/124 |

(Continued)

FOREIGN PATENT DOCUMENTS

| CN | 102470771 A | 5/2012 |
| JP | 2008-59910 A | 3/2008 |

(Continued)

*Primary Examiner* — Drew A Dunn
*Assistant Examiner* — Jerry D Robbins
(74) *Attorney, Agent, or Firm* — Sughrue Mion, PLLC

(57) ABSTRACT

A battery system includes a chargeable and dischargeable secondary battery and a controller that estimates the deterioration state or the charge state of the secondary battery. When estimating the deterioration state or the charge state, the controller uses an average ion concentration between a positive electrode and a negative electrode. The average ion concentration varies depending on an electric current flowing through the secondary battery. The average ion concentration between the electrodes can be calculated with a computing expression that includes a surface pressure of the secondary battery as a variable. The surface pressure of the secondary battery can be detected by a pressure sensor. The surface pressure of the secondary battery can also be estimated from an electric current flowing through the secondary battery.

13 Claims, 17 Drawing Sheets

(58) Field of Classification Search
USPC .......................................................... 324/432
See application file for complete search history.

(56) References Cited

U.S. PATENT DOCUMENTS

| | | | |
|---|---|---|---|
| 8,975,897 B2* | 3/2015 | Yoshioka | G01R 31/3651 |
| | | | 320/132 |
| 9,197,089 B2* | 11/2015 | Choe | H02J 7/007 |
| 9,203,122 B2* | 12/2015 | Raghavan | H01M 10/48 |
| 2010/0033132 A1 | 2/2010 | Nishi et al. | |
| 2010/0085057 A1 | 4/2010 | Nishi et al. | |
| 2010/0241376 A1 | 9/2010 | Kikuchi et al. | |
| 2012/0098497 A1* | 4/2012 | Ogane | B60K 6/485 |
| | | | 320/134 |
| 2013/0027047 A1 | 1/2013 | Yoshioka et al. | |

FOREIGN PATENT DOCUMENTS

| | | |
|---|---|---|
| JP | 2008-243373 A | 10/2008 |
| JP | 2009-123435 A | 6/2009 |
| JP | 2012-108046 A | 6/2012 |
| JP | 2012-225713 A | 11/2012 |
| WO | 2011/001266 A2 | 1/2011 |
| WO | 2011/155017 A1 | 12/2011 |

* cited by examiner

DIRECTION IN ELECTRODE PLANE

FIG. 7

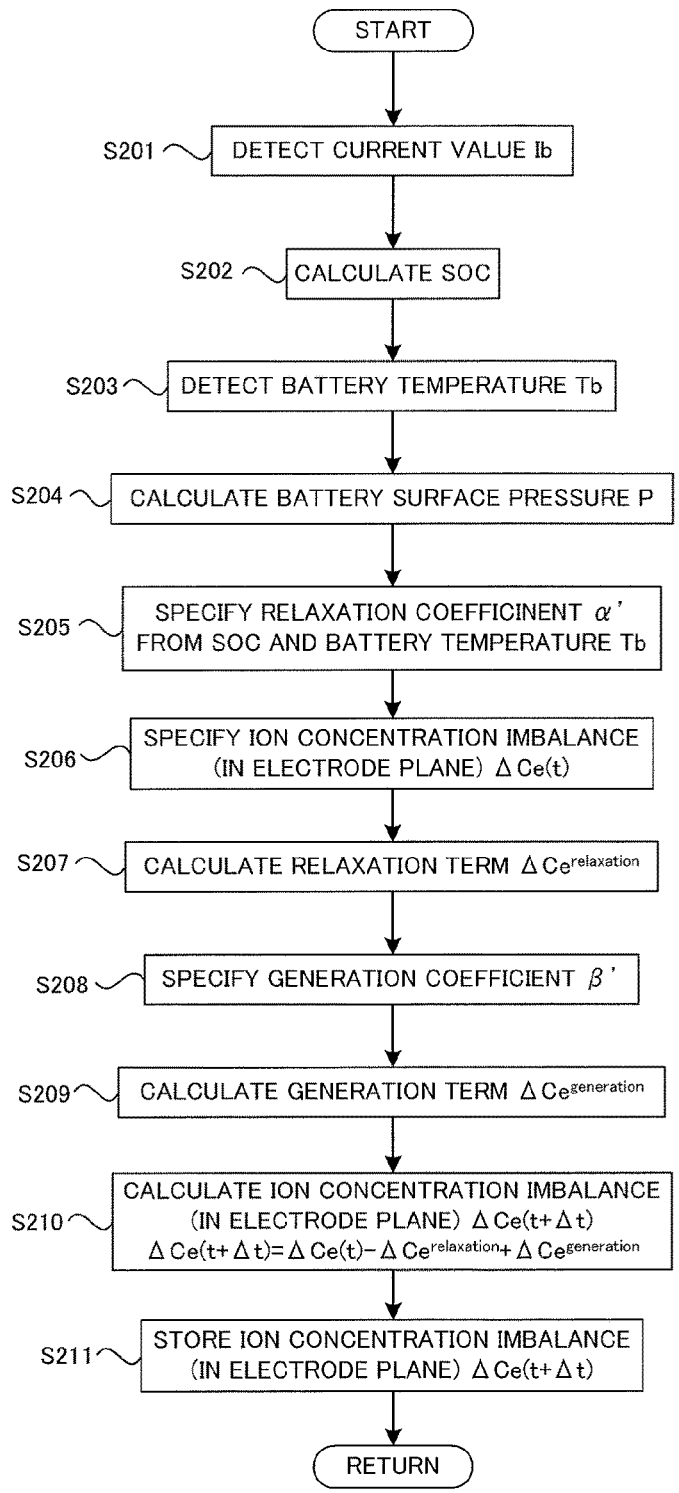

START

S201 — DETECT CURRENT VALUE Ib

S202 — CALCULATE SOC

S203 — DETECT BATTERY TEMPERATURE Tb

S204 — CALCULATE BATTERY SURFACE PRESSURE P

S205 — SPECIFY RELAXATION COEFFICINENT $\alpha'$ FROM SOC AND BATTERY TEMPERATURE Tb S206 — SPECIFY ION CONCENTRATION IMBALANCE (IN ELECTRODE PLANE) $\Delta Ce(t)$ S207 — CALCULATE RELAXATION TERM $\Delta Ce^{relaxation}$ S208 — SPECIFY GENERATION COEFFICIENT $\beta'$ S209 — CALCULATE GENERATION TERM $\Delta Ce^{generation}$ S210 — CALCULATE ION CONCENTRATION IMBALANCE (IN ELECTRODE PLANE) $\Delta Ce(t+\Delta t)$
$\Delta Ce(t+\Delta t) = \Delta Ce(t) - \Delta Ce^{relaxation} + \Delta Ce^{generation}$ S211 — STORE ION CONCENTRATION IMBALANCE (IN ELECTRODE PLANE) $\Delta Ce(t+\Delta t)$

RETURN

FIG. 14

| Symbol | Description |
|---|---|
| $C_{ej}$ | LITHIUM CONCENTRATION IN ELECTROLYTIC SOLUTION |
| $C_{sj}$ | LITHIUM CONCENTRATION IN ACTIVE MATERIAL |
| $C_{sj,max}$ | MAXIMUM LITHIUM CONCENTRATION |
| $C_{sej}$ | LITHIUM CONCENTRATION AT ACTIVE MATERIAL INTERFACE |
| $\phi_{ej}$ | POTENTIAL OF ELECTROLYTIC SOLUTION |
| $\phi_{sj}$ | POTENTIAL OF ACTIVE MATERIAL |
| $T$ | ABSOLUTE TEMPERATURE |
| $j_j^{Li}$ | PRODUCED LITHIUM AMOUNT PER UNIT VOLUME AND PER UNIT TIME (REACTION CURRENT DENSITY) $$I = \int j_j^{Li} dv$$ |
| $\alpha_{sj}$ | TRANSFER COEFFICIENT FOR ELECTRODE REACTION $J_j^{Li}$ (OXIDATION REACTION) |
| $\alpha_{cj}$ | TRANSFER COEFFICIENT FOR ELECTRODE REACTION $J_j^{Li}$ (REDUCTION REACTION) $\alpha sj + \alpha cj = 1$ |
| $F$ | FARADAY'S CONSTANT |
| $i_{0j}$ | EXCHANGE CURRENT DENSITY |
| $\eta_j$ | OVERVOLTAGE FOR ELECTRODE REACTION $J_j^{Li}$ |
| $U_j$ | OPEN CIRCUIT VOLTAGE (OCV) |
| $\theta_j$ | LOCAL SOC AT ACTIVE MATERIAL INTERFACE $$\theta_j = \frac{C_{sej}}{C_{sj,max}}$$ |
| $R_f$ | FILM RESISTANCE OF ELECTRODE SURFACE |
| $t_+^0$ | LITHIUM ION TRANSPORT NUMBER |
| $D_{sj}$ | DIFFUSION COEFFICIENT OF ACTIVE MATERIAL |
| $D_{ej}^{eff}$ | EFFECTIVE DIFFUSION COEFFICIENT OF ELECTROLYTIC SOLUTION |
| $a_{sj}$ | SURFACE AREA OF ACTIVE MATERIAL PER UNIT VOLUME OF ELECTRODE |
| $r_{sj}$ | RADIUS OF ACTIVE MATERIAL |
| $\varepsilon_{sj}$ | VOLUME FRACTION (ACTIVE MATERIAL) $\varepsilon_s + \varepsilon_e + \varepsilon_p + \varepsilon_f = 1$ |
| $\varepsilon_{ej}$ | VOLUME FRACTION (ELECTROLYTIC SOLUTION) |
| $K_j^{eff}$ | EFFECTIVE ION CONDUCTIVITY OF ELECTROLYTIC SOLUTION |
| $K_{Dj}^{eff}$ | DIFFUSION CONDUCTIVITY OF ELECTROLYTIC SOLUTION |
| $\sigma_j^{eff}$ | EFFECTIVE CONDUCTIVITY OF ACTIVE MATERIAL |
| $I$ | CURRENT DENSITY (PER UNIT SURFACE AREA OF ELECTRODE PLATE) |
| $L_j$ | THICKNESS OF ELECTRODE |

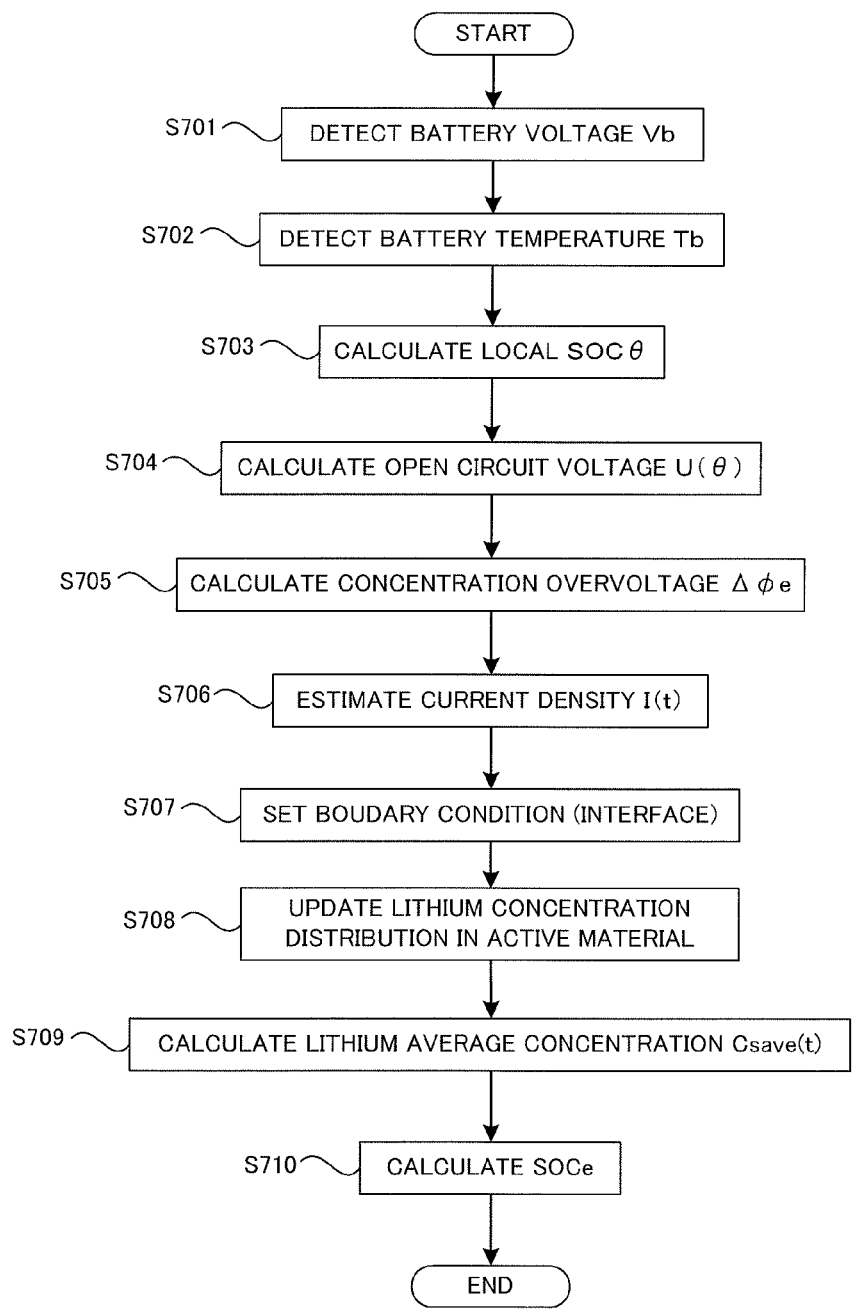

STATE OF DETERIORATION OR STATE OF CHARGES ESTIMATING APPARATUS FOR SECONDARY BATTERY

CROSS REFERENCE TO RELATED APPLICATIONS

This application is a National Stage of International Application No. PCT/JP2013/000581 filed Feb. 1, 2013, the contents of all of which is incorporated herein by reference in its entirety.

TECHNICAL FIELD

The present invention relates to a battery system in which the deterioration state and the charge state of a secondary battery are estimated.

BACKGROUND ART

Patent Document 1 has described that an evaluation value is calculated in accordance with a change of imbalance in concentration of lithium ions in an electrolytic solution, and the output from the secondary battery is controlled on the basis of the evaluation value. The evaluation value is a value for evaluating the deterioration of the secondary battery.

When the secondary battery is discharged, the lithium ions in the electrolytic solution move from a negative electrode toward a positive electrode to produce the imbalance in the concentration of the lithium ions in the electrolytic solution. Assuming that the imbalance in the lithium ion concentration is a factor in deterioration of the secondary battery, the evaluation value is calculated in accordance with the imbalance in the lithium ion concentration between electrodes in Patent Document 1.

PRIOR ART DOCUMENT

Patent Document

[Patent Document 1] Japanese Patent Laid-Open No. 2009-123435

DISCLOSURE OF THE INVENTION

Problems to be Solved by the Invention

When the secondary battery is charged and discharged, the imbalance in the lithium ion concentration is not produced only between the electrodes. Specifically, an imbalance in lithium ion concentration may occur in a plane in which the positive electrode and the negative electrode are opposite to each other, and the concentration of lithium ions present between the positive electrode and the negative electrode may be changed. The imbalance in the lithium ion concentration in the plane of the electrodes and the change in the lithium ion concentration between the electrodes also affect the deterioration of the secondary battery.

Means for Solving the Problems

A battery system according to an aspect of the present invention includes a chargeable and dischargeable secondary battery, and a controller configured to estimate the deterioration state or the charge state of the secondary battery. When the controller estimates the deterioration state or the charge state, the controller uses an average ion concentration between a positive electrode and a negative electrode. The average ion concentration is changed in accordance with an electric current flowing through the secondary battery.

The average ion concentration between the positive electrode and the negative electrode, that is, the amount of ions present between the positive electrode and the negative electrode, is changed depending on the electric current flowing through the secondary battery. For example, an electrolytic solution leaks from between the positive electrode and the negative electrode depending on the discharge state of the secondary battery, resulting in a reduction in the average ion concentration between the electrodes.

Such a change in the average ion concentration between the electrodes influences the deterioration state and the charge state of the secondary battery. In view of this, in the present invention, the average ion concentration between the electrodes is taken into account in estimating the deterioration state and the charge state of the secondary battery. This can provide a knowledge of the deterioration state and the charge state in which the average ion concentration is incorporated.

The average ion concentration between the electrodes can be calculated with a computing expression including a surface pressure of the secondary battery as a variable. Since the average ion concentration between the electrodes depends on the surface pressure of the secondary battery, the average ion concentration between the electrodes can be calculated once the surface pressure of the secondary battery can be obtained.

For example, variations in the surface pressure cause the electrolytic solution to leak from between the positive electrode and the negative electrode to reduce the average ion concentration. The average ion concentration between the electrodes can be calculated once the surface pressure of the secondary battery is obtained. The surface pressure of the secondary battery can be detected by a pressure sensor. Since the surface pressure of the secondary battery depends on an electric current flowing through the secondary battery, the surface pressure can also be estimated from the electric current through the secondary battery. The electric current through the secondary battery can be detected by a current sensor.

The deterioration state or the charge state of the secondary battery depends not only on the average ion concentration but also on an ion concentration imbalance between the positive electrode and the negative electrode. The accuracy in estimating the deterioration state and the charge state can be improved by finding not only the average ion concentration between the electrodes but also the ion concentration imbalance between the electrodes.

The ion concentration imbalance between the electrodes is changed in accordance with the electric current flowing through the secondary battery. When a current sensor is used to detect the electric current flowing through the secondary battery, the ion concentration imbalance between the electrodes can be calculated. Specifically, the ion concentration imbalance between the electrodes can be calculated by substituting a value detected by the current sensor into a computing expression including the current value as a variable.

The deterioration state of the secondary battery depends not only on the average ion concentration but also on an ion concentration imbalance in a plane (in an electrode plane) in which the positive electrode and the negative electrode are opposite to each other. The accuracy in estimating the deterioration state can be improved by finding not only the average ion concentration between the electrodes but also the ion concentration imbalance in the electrode plane.

The ion concentration imbalance in the electrode plane depends on the surface pressure of the secondary battery. Specifically, variations in the surface pressure tend to cause the ion concentration imbalance in the electrode plane. Once the surface pressure of the secondary battery is obtained, the ion concentration imbalance in the electrode plane can be calculated. Specifically, the ion concentration imbalance can be calculated by using a computing expression including the surface pressure as a variable.

When the average ion concentration between the electrodes, the ion concentration imbalance between the electrodes, and the ion concentration imbalance in the electrode plane are obtained, the accuracy in estimating the deterioration state can be further improved. The controller can limit an output from or an input to the secondary battery when the deterioration state is estimated and a parameter specifying the estimated deterioration state is larger than a threshold value.

This can prevent an increase in the parameter specifying the deterioration state to extend the life of the secondary battery. When the accuracy in estimating the deterioration state can be improved as described above, excessive limitation of the input to and output from the secondary battery can be avoided to improve the input/output characteristics of the secondary battery. In addition, excessive relaxation of the input to and output from the secondary battery can also be prevented to avoid extremely advanced deterioration of the secondary battery. As a result, the life of the secondary battery can be extended.

The charge state of the secondary battery can be estimated by calculating an average ion concentration in an active material. When the correspondence between the average ion concentration in the active material and the charge state is previously determined, the charge state of the secondary battery can be specified by calculating the average ion concentration in the active material. The average ion concentration in the active material can be calculated from the ion concentration distribution in the active material.

The ion concentration distribution in the active material can be calculated with a diffusion equation after a boundary condition at an interface of the active material is set. Since the boundary condition depends on a current density, the boundary condition can be specified by calculating the current density. The current density can be calculated from the voltage and the concentration overvoltage of the secondary battery by using a battery model expression.

The voltage of the secondary battery can be detected with a voltage sensor. The concentration overvoltage depends on the average ion concentration between the electrodes and the ion concentration imbalance between the electrodes. The concentration overvoltage can be obtained by calculating the average ion concentration between the electrodes and the ion concentration imbalance between the electrodes as described above.

BRIEF DESCRIPTION OF THE DRAWINGS

FIG. 7 is a flow chart showing the processing of calculating the ion concentration imbalance in the electrode plane.
FIG. 14 is a table showing a list of variables and the like used in a battery model expression.
FIG. 22 is a flow chart showing the processing of estimating the SOC.

MODE FOR CARRYING OUT THE INVENTION

Embodiments of the present invention will hereinafter be described.

Embodiment 1

Figure 1:
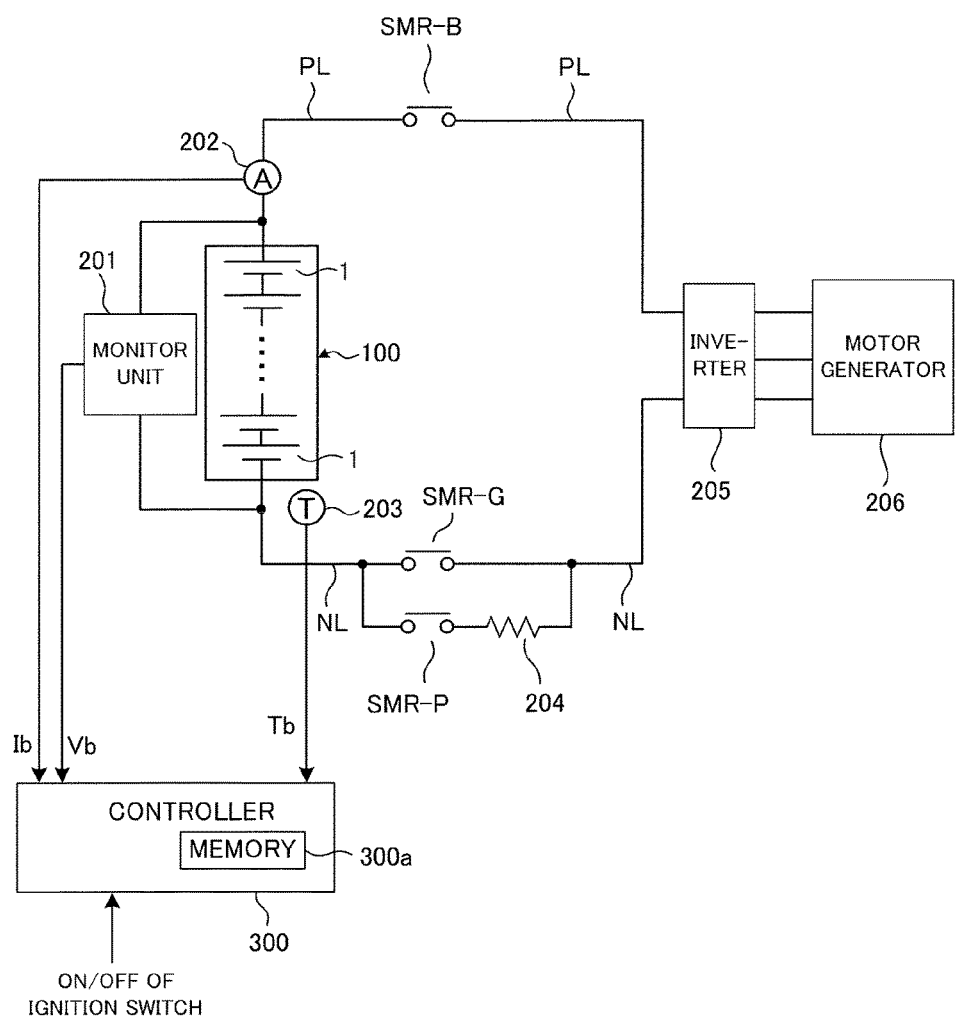
FIG. 1 is a diagram showing the configuration of a battery system.

FIG. 1 is a diagram showing the configuration of a battery system which is Embodiment 1. The battery system shown in FIG. 1 can be mounted on a vehicle. Examples of the vehicle include a HV (Hybrid Vehicle), a PHV (Plug-in Hybrid Vehicle), and an EV (Electric Vehicle). The present invention is applicable to any system that is used to charge and discharge a secondary battery.

The HV includes not only an assembled battery, later described, but also another power source such as an internal-combustion engine or a fuel cell, as the power source for running of the vehicle. The PHV is a variant of the HV in which the assembled battery can be charged with electric power from an external power source. The EV includes only the assembled battery as the power source of the vehicle and allows charge of the assembled battery by receiving electric power from the external power source. The external power source is a power source (for example, a commercial power source) provided outside and independently of the vehicle.

The assembled battery 100 includes a plurality of secondary batteries 1 electrically connected in series. Examples of the secondary battery 1 serving as a cell include a nickel metal hydride battery and a lithium-ion battery. The number of the secondary batteries 1 can be set as appropriate based on the output required of the assembled battery 100 or the like.

Although all the secondary batteries 1 are connected electrically in series in the assembled battery 100 of the present embodiment, the present invention is not limited thereto. Specifically, the assembled battery 100 may include a plurality of secondary batteries 1 connected electrically in parallel. A monitor unit 201 detects a voltage between terminals of the assembled battery 100 or detects a voltage Vb of each secondary battery 1 and outputs the detection result to a controller 300.

When the plurality of secondary batteries 1 constituting the assembled battery 100 is grouped into a plurality of battery blocks, the monitor unit 201 can also detect the voltage of each battery block. The battery block is formed of a plurality of secondary batteries 1 connected electrically in series, and a plurality of such battery blocks are connected electrically in series to constitute the assembled battery 100.

A current sensor 202 detects a current Ib flowing through the assembled battery 100 and outputs the detection result to the controller 300. In the present embodiment, it is assumed that a discharge current Ib has a positive value (Ib>0) and a charge current Ib has a negative value (Ib<0). Although the current sensor 202 is provided on a positive electrode line PL connected to a positive electrode terminal of the assembled battery 100 in the present embodiment, the present invention is not limited thereto. The current sensor 202 is only required to detect the current Ib. For example, the current sensor 202 can be provided on a negative electrode line NL connected to a negative electrode terminal of the assembled battery 100. A plurality of current sensors 202 may be provided.

A temperature sensor 203 detects a temperature Tb of the assembled battery 100 (secondary battery 1) and outputs the detection result to the controller 300. The number of the temperature sensors 203 can be set as appropriate. When a plurality of temperature sensors 203 are used, temperatures Tb of a plurality of secondary batteries 1 disposed at different positions can be detected.

The controller 300 includes a memory 300*a*. The memory 300*a* stores various types of information for allowing the controller 300 to perform predetermined processing (for example, processing described in the present embodiment). Although the memory 300*a* is contained in the controller 300 in the present embodiment, the memory 300*a* may be provided outside the controller 300.

The positive electrode line PL is provided with a system main relay SMR-B. The system main relay SMR-B is switched between ON and OFF in response to a control signal from the controller 300. The negative electrode line NL is provided with a system main relay SMR-G. The system main relay SMR-G is switched between ON and OFF in response to a control signal from the controller 300.

The system main SMR-G is connected electrically in parallel to a system main relay SMR-P and a current limiting resistor 204. The system main relay SMR-P and the current limiting resistor 204 are connected electrically in series. The system main relay SMR-P is switched between ON and OFF in response to a control signal from the controller 300. The current limiting resistor 204 is used to prevent a flow of inrush current when the assembled battery 100 is connected to a load (specifically, an inverter 205).

For connecting the assembled battery 100 to the inverter 205, the controller 300 first switches the system main relay SMR-B from OFF to ON and the system main relay SMR-P from OFF to ON. This causes an electric current to pass through the current limiting resistor 204.

Next, the controller 300 switches the system main relay SMR-G from OFF to ON and switches the system main relay SMR-P from ON to OFF. This completes the connection between the assembled battery 100 and the inverter 205, and the battery system shown in FIG. 1 is in Ready-On state. The controller 300 receives information about an ignition switch of the vehicle. The controller 300 starts the battery system shown in FIG. 1 in response to switching of the ignition switch from OFF to ON.

On the other hand, when the ignition switch is switched from ON to OFF, the controller 300 switches the system main relays SMR-B and SMR-G from ON to OFF. This breaks the connection between the assembled battery 100 and the inverter 205, and the battery system shown in FIG. 1 is in Ready-Off state.

The inverter 205 converts a DC power from the assembled battery 100 into an AC power and outputs the AC power to a motor generator 206. For example, a three-phase AC motor can be used as the motor generator 206. The motor generator 206 receives the AC power from the inverter 205 to generate a kinetic energy for running of the vehicle. The kinetic energy generated by the motor generator 206 is transferred to wheels to enable the running of the vehicle.

For decelerating or stopping the vehicle, the motor generator 206 converts a kinetic energy generated in braking of the vehicle into an electric energy (AC power). The inverter 205 converts the AC power generated by the motor generator 206 into a DC power and outputs the DC power to the assembled battery 100. Thus, the assembled battery 100 can accumulate the regenerative electric power.

Although the assembled battery 100 is connected to the inverter 205 in the present embodiment, the present invention is not limited thereto. Specifically, a step-up circuit can be provided on the current path connecting the assembled battery 100 with the inverter 205. The step-up circuit can increase the voltage output from the assembled battery 100 and output the electric power at the increased voltage to the inverter 205. The step-up circuit can also reduce the voltage output from the inverter 205 and output the electric power at the reduced voltage to the assemble battery 100.

Figure 2:
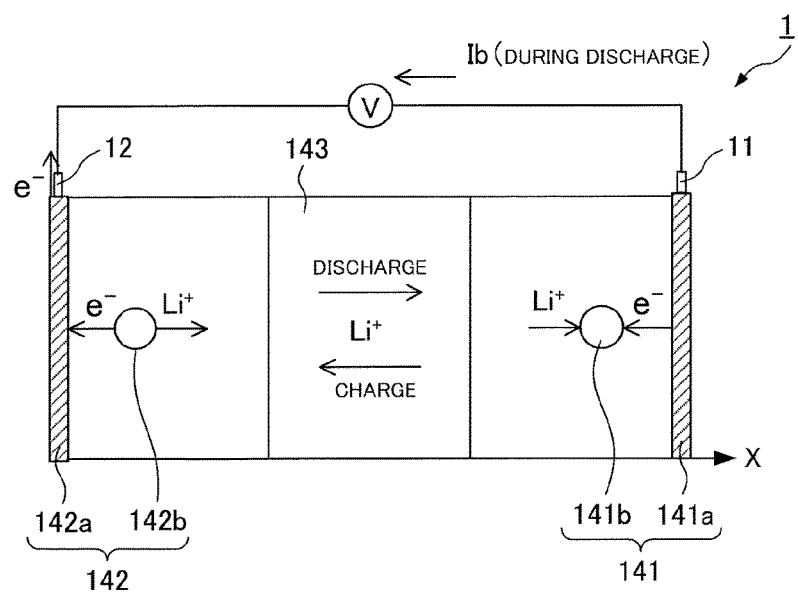
FIG. 2 is a schematic diagram showing the configuration of a secondary battery.

Next, the configuration of the secondary battery 1 is described with reference to FIG. 2. In FIG. 2, a lithium-ion secondary battery is used as an example of the secondary battery 1. An coordinate axis x shown in FIG. 2 indicates positions in a thickness direction of the electrode.

The secondary battery 1 has a positive electrode 141, a negative electrode 142, and a separator 143. The separator 143 is located between the positive electrode 141 and the negative electrode 142 and contains an electrolytic solution. A solid electrolyte may be used instead of the electrolytic solution. In this case, a layer of the solid electrolyte can be disposed between the positive electrode 141 and the negative electrode 142.

The positive electrode 141 has a collector plate 141*a* made of aluminum or the like. The collector plate 141*a* is electrically connected to a positive electrode terminal 11 of the secondary battery 1. The negative electrode 142 has a collector plate 142*a* made of copper or the like. The collector plate 142a is electrically connected to a negative electrode terminal 12 of the secondary battery 1.

The negative electrode 142 and the positive electrode 141 have groups of spherical active materials 142b and 141b, respectively. As shown in FIG. 2, when the secondary battery 1 is discharged, a chemical reaction occurs at the interface of the active material 142b in the negative electrode 142 to release a lithium ion Li$^+$ and an electron e$^-$. In addition, a chemical reaction occurs at the interface of the active material 141b in the positive electrode 141 to absorb a lithium ion Li$^+$ and an electron e$^-$.

When the secondary battery 1 is charged, a chemical reaction occurs at the interface of the active material 142b in the negative electrode 142 to absorb a lithium ion Li$^+$ and an electron e$^-$. In addition, a chemical reaction occurs at the interface of the active material 141b in the positive electrode 141 to release a lithium ion Li$^+$ and an electron e$^-$. The lithium ions Li$^+$ are passed between the negative electrode 142 and the positive electrode 141 in this manner to perform charge and discharge of the secondary battery 1 to produce the charge current Ib (Ib<0) or the discharge current Ib (Ib>0).

Three states occur in the concentration of lithium ions in the electrolytic solution. The three states described below influence the performance (in other words, the deterioration state) of the secondary battery 1. It is thus preferable to consider the three states described below in order to keep track of the performance of the secondary battery 1.

A first state relates to a lithium ion concentration imbalance between the positive electrode 141 and the negative electrode 142. As described above, when the secondary battery 1 is charged or discharged, the lithium ions move in the electrolytic solution from one electrode toward the other electrode. As a result, the lithium ions are located predominantly in the positive electrode 141 or the negative electrode 142 depending on the charge or discharge of the secondary battery 1. Specifically, when the secondary battery 1 is discharged, the lithium ions are located predominantly in the positive electrode 141. When the secondary battery 1 is charged, the lithium ions are located predominantly in the negative electrode 142.

Figure 3:
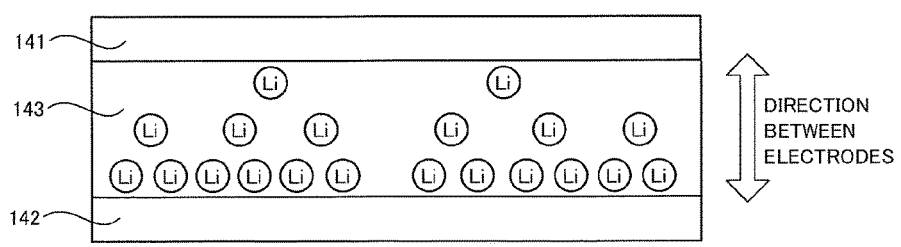
FIG. 3 is a diagram for explaining an ion concentration imbalance between electrodes.

FIG. 3 shows the lithium ion concentration imbalance between the positive electrode 141 and the negative electrode 142 (by way of example). An arrow shown in FIG. 3 indicates a direction in which the lithium ion concentration imbalance occurs. In other words, the arrow shown in FIG. 3 indicates the direction in which the separator 143 (electrolytic solution) is sandwiched between the positive electrode 141 and the negative electrode 142. The example shown in FIG. 3 represents the state in which the lithium ion concentration is increased close to the negative electrode 142.

Specifically, the lithium ion concentration close to the negative electrode 142 is higher than the lithium ion concentration close to the positive electrode 141. The lithium ion concentration may be increased close to the positive electrode 141. In this case, the lithium ion concentration close to the positive electrode 141 is higher than the lithium ion concentration close to the negative electrode 142.

A second state relates to a lithium ion concentration imbalance in a plane of the electrode. When the secondary battery 1 is charged or discharged, the lithium ion concentration imbalance may be found not only between the positive electrode 141 and the negative electrode 142 but also in the plane of the electrode. The plane of the electrode means a plane (referred to as an electrode plane) in which the positive electrode 141 and the negative electrode 142 are opposite to each other.

Figure 4:
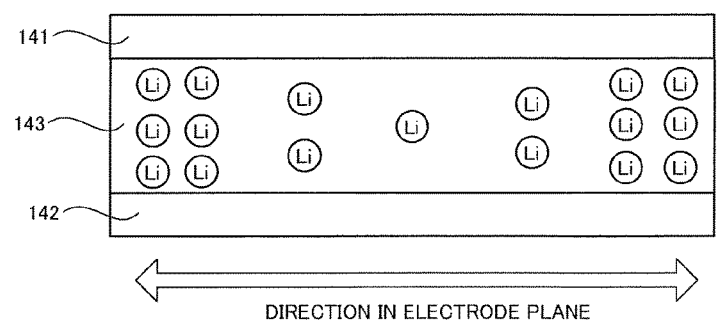
FIG. 4 is a diagram for explaining an ion concentration imbalance in an electrode plane.

FIG. 4 shows the lithium ion concentration imbalance in the electrode plane (by way of example). An arrow shown in FIG. 4 indicates a direction in which the lithium ion concentration imbalance occurs. The electrode plane is a plane orthogonal to the sheet of FIG. 4, and the arrow shown in FIG. 4 represents a direction which defines the electrode plane. The direction shown by the arrow in FIG. 4 and the direction orthogonal thereto define the electrode plane.

The example shown in FIG. 4 represents the state in which the lithium ion concentration is increased close to both ends of the positive electrode 141 and the negative electrode 142. Both ends of the positive electrode 141 and the negative electrode 142 refer to both ends of the positive electrode 141 and the negative electrode 142 in the direction shown by the arrow in FIG. 4. When the secondary battery 1 is discharged, the lithium ion concentration imbalance may occur as shown in FIG. 4. In this case, the lithium ion concentration at both ends of the positive electrode 141 and the negative electrode 142 is higher than the lithium ion concentration at the center of the positive electrode 141 and the negative electrode 142.

When the secondary battery 1 is charged, the lithium ion concentration imbalance behaves oppositely to that shown in FIG. 4. Specifically, when the secondary battery 1 is charged, the lithium ion concentration may be increased close to the center of the positive electrode 141 and the negative electrode 142. In this case, the lithium ion concentration at the center of the positive electrode 141 and the negative electrode 142 is higher than the lithium ion concentration at both ends of the positive electrode 141 and the negative electrode 142.

A third state relates to a change in lithium ion concentration within the electrolytic solution. When the pressure in the electrode plane varies, the electrolytic solution may be pushed out from between the positive electrode 141 and the negative electrode 142. Specifically, when the secondary battery 1 is discharged, the electrolytic solution may be pushed out from between the positive electrode 141 and the negative electrode 142.

The pushing out of the electrolytic solution reduces the lithium ions present between the positive electrode 141 and the negative electrode 142. In other words, the lithium ions contributing to the charge and discharge of the secondary battery 1 are reduced. The reduction in the lithium ions lowers the average value of the concentration of the lithium ions located between the positive electrode 141 and the negative electrode 142. As described above, the lithium ion concentration imbalance may occur between the positive electrode 141 and the negative electrode 142. To allow for such an imbalance, the average value of the lithium ion concentration is used. The average value of the lithium ion concentration is referred to as an average ion concentration.

Figure 5:
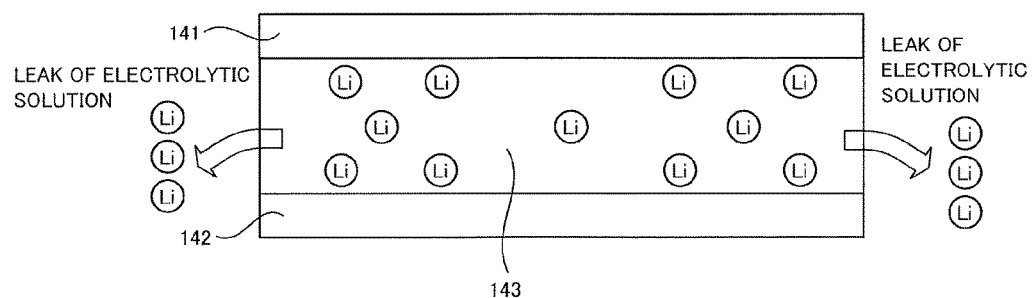
FIG. 5 is a diagram for explaining an average ion concentration between electrodes.

As the secondary battery 1 is charged or discharged at a higher rate (current value), more pressure variations occur in the electrode plane. FIG. 5 shows the state in which the average ion concentration is lowered (by way of example). When the pressure variations occur in the electrode plane, the electrolytic solution leaks from between the positive electrode 141 and the negative electrode 142 as shown in FIG. 5. The state shown in FIG. 5 occurs when the secondary battery 1 is discharged.

When the secondary battery 1 is charged, the behavior opposite to that shown in FIG. 5 occurs. Specifically, when the secondary battery 1 is charged to cause pressure variations in the electrode plane, the electrolytic solution enters between the positive electrode 141 and the negative electrode 142. This raises the average ion concentration.

With respect to the first state described above, the lithium ion concentration imbalance between the positive electrode and the negative electrode is referred to as an inter-electrode ion concentration imbalance. The inter-electrode ion concentration imbalance can be calculated on the basis of the following expression (1):

$$dCe(t+\Delta t)=dCe(t)-dCe^{relaxation}+dCe^{generation} \qquad (1)$$

In the above expression (1), dCe represents the inter-electrode ion concentration imbalance, t represents time, and $\Delta t$ represents a cycle (cycle time) for calculating the ion concentration imbalance. As shown in the expression (1), the ion concentration imbalance $dCe(t+\Delta t)$ after the elapse of the cycle time $\Delta t$ is calculated on the basis of the ion concentration imbalance $dCe(t)$ at a time t (previous time).

The cycle time $\Delta t$ can be set as appropriate. As the cycle time $\Delta t$ is shorter, the ion concentration imbalance dCe can be determined more accurately. However, as the cycle time $\Delta t$ is shorter, the computing load is increased. Thus, the value of the cycle time $\Delta t$ can be set as appropriate by considering the accuracy of the ion concentration imbalance dCe and the computing load.

In the above expression (1), $dCe^{relaxation}$ represents a term (relaxation term) for relaxing the ion concentration imbalance during the cycle time $\Delta t$. The relaxation term $dCe^{relaxation}$ is subtracted from the ion concentration imbalance dCe (t) at the time t (the previous time). As the relaxation term $dCe^{relaxation}$ is increased, the ion concentration imbalance $dCe(t+\Delta t)$ is reduced, that is, the inter-electrode ion concentration imbalance dCe is reduced.

In the above expression (1), $dCe^{generation}$ represents a term (generation term) for generating the ion concentration imbalance during the cycle time $\Delta t$. The generation term $dCe^{generation}$ is added to the ion concentration imbalance dCe (t) at the time t (the previous time). As the generation term $dCe^{generation}$ is increased, the ion concentration imbalance dCe ($t+\Delta t$) is increased, that is, the lithium ion concentration imbalance between the electrodes tends to be increased.

As described above, the inter-electrode ion concentration imbalance includes the state in which the lithium ion concentration is increased close to the positive electrode 141 and the state in which the lithium ion concentration is increased close to the negative electrode 142. The ion concentration imbalance dCe can be calculated for each of the state in which the lithium ion concentration is increased close to the positive electrode 141 and the state in which the lithium ion concentration is increased close to the negative electrode 142. This can determine the ion concentration imbalance dCe when the secondary battery 1 is preferentially discharged or determine the ion concentration imbalance dCe when the secondary battery 1 is preferentially charged.

The relaxation term $dCe^{relaxation}$ can be calculated, for example, based on the following expression (2). It should be noted that the expression for calculating the relaxation term $dCe^{relaxation}$ is not limited to the following expression (2), and any expression may be used as long as the relaxation of the inter-electrode ion concentration imbalance can be specified:

$$dCe^{relaxation}=\alpha \times dCe(t) \times \Delta t \qquad (2)$$

In the expression (2), dCe(t) represents the ion concentration imbalance at the time t (previous time) and $\Delta t$ represents the cycle time described above. According to the above expression (2), the relaxation term $dCe^{relaxation}$ depends on the ion concentration imbalance dCe(t) and the cycle time $\Delta t$.

$\alpha$ represents a relaxation coefficient. The relaxation coefficient $\alpha$ depends on the State Of Charge (SOC), the temperature Tb of the secondary battery 1 and the like. Once the correspondence (map) between the relaxation coefficient $\alpha$ and the SOC is determined by experiment or the like, the SOC is estimated and then the relaxation coefficient $\alpha$ corresponding to the estimated SOC can be specified. The SOC refers to the proportion of the present charge capacity to the full charge capacity.

Once the correspondence (map) between the relaxation coefficient $\alpha$ and the battery temperature Tb is determined by experiment or the like, the battery temperature Tb is detected and then the relaxation coefficient $\alpha$ corresponding to the detected temperature Tb can be specified. The correspondence (map) between the SOC and the battery temperature Tb and the relaxation coefficient $\alpha$ may be previously determined by experiment or the like. In this case, the SOC is estimated and the battery temperature Tb is detected, and then the relaxation coefficient $\alpha$ corresponding to that SOC and that battery temperature Tb can be specified. The map for specifying the relaxation coefficient $\alpha$ can be stored in the memory 300a.

The generation term $dCe^{generation}$ can be calculated, for example, based on the following expression (3). It should be noted that the expression for calculating the generation term $dCe^{generation}$ is not limited to the following expression (3), and any expression may be used as long as the generation of the inter-electrode ion concentration imbalance can be specified:

$$dCe^{generation}=\beta \times Ib(t) \times \Delta t \qquad (3)$$

In the expression (3), Ib(t) represents the value of current flowing through the secondary battery 1 at time the t and $\Delta t$ represents the cycle time described above. The value (absolute value) detected by the current sensor 202 is used as the current value Ib. According to the above expression (3), the generation term $dCe^{generation}$ depends on the current value Ib(t) and the cycle time $\Delta t$.

$\beta$ represents a generation coefficient. The generation coefficient $\beta$ depends on the SOC, the temperature Tb of the secondary battery 1 and the like. The correspondence (map) between at least one of the SOC and the battery temperature Tb and the generation coefficient $\beta$ can be previously determined by experiment or the like. Through the use of the map, the SOC is estimated or the battery temperature Tb is detected, and then the generation coefficient $\beta$ corresponding to at least one of that SOC and that battery temperature Tb can be specified. The map for specifying the generation coefficient $\beta$ can be stored in the memory 300a.

With respect to the second state described above, the lithium ion concentration imbalance in the electrode plane can be calculated on the basis of the following expression (4):

$$\Delta Ce(t+\Delta t)=\Delta Ce(t)-\Delta Ce^{relaxation}\Delta Ce^{generation} \qquad (4)$$

In the above expression (4), $\Delta Ce$ represents the ion concentration imbalance in the electrode plane, t represents time, and $\Delta t$ represents the cycle (cycle time) for calculating the ion concentration imbalance $\Delta Ce$ and is the same as the cycle time described in the above expression (1). As shown in the expression (4), the ion concentration imbalance $\Delta Ce$ (t+Δt) after the elapse of the cycle time Δt is calculated on the basis of the ion concentration imbalance ΔCe(t) at the time t (the previous time).

In the above expression (4), $\Delta Ce^{relaxation}$ represents a term (relaxation term) for relaxing the ion concentration imbalance during the cycle time Δt. The relaxation term $\Delta Ce^{relaxation}$ is subtracted from the ion concentration imbalance ΔCe(t) at the time t (the previous time). As the relaxation term $\Delta Ce^{relaxation}$ is increased, the ion concentration imbalance ΔCe(t+Δt) is reduced, that is, the lithium ion concentration imbalance in the electrode plane is reduced.

In the above expression (4), $\Delta Ce^{generation}$ represents a term (generation term) for generating the ion concentration imbalance during the cycle time Δt. The generation term $\Delta Ce^{generation}$ is added to the ion concentration imbalance ΔCe(t) at the time t (the previous time). As the generation term $\Delta Ce^{generation}$ is increased, the ion concentration imbalance ΔCe(t+Δt) is increased, that is, the lithium ion concentration imbalance in the electrode plane tends to be increased.

As described above, the ion concentration imbalance in the electrode plane includes the state in which the lithium ion concentration is increased close to both ends of the positive electrode 141 and the negative electrode 142 (see FIG. 4) and the state in which the lithium ion concentration is increased close to the center of the positive electrode 141 and the negative electrode 142. The ion concentration imbalance ΔCe can be calculated for each of the two states. This can determine the ion concentration imbalance ΔCe when the secondary battery 1 is preferentially discharged or determine the ion concentration imbalance ΔCe when the secondary battery 1 is preferentially charged.

The relaxation term $\Delta Ce^{relaxation}$ can be calculated, for example, based on the following expression (5). It should be noted that the expression for calculating the relaxation term is not limited to the following expression (5), and any expression may be used as long as the relaxation of the ion concentration imbalance in the electrode plane can be specified:

$$\Delta Ce^{relaxation} = \alpha' \times \Delta Ce(t) \times \Delta t \quad (5)$$

In the expression (5), ΔCe(t) represents the ion concentration imbalance at the time t (previous time) and Δt represents the cycle time described above. According to the above expression (5), the relaxation term $\Delta Ce^{relaxation}$ depends on the ion concentration imbalance ΔCe(t) and the cycle time Δt.

α' represents a relaxation coefficient. The relaxation coefficient α' depends on the SOC, the temperature Tb of the secondary battery 1 and the like. The correspondence (map) between the relaxation coefficient α' and at least one of the SOC and the battery temperature Tb can be previously determined by experiment or the like. The SOC is estimated or the battery temperature Tb is detected, and then the relaxation coefficient α' corresponding to at least one of that SOC and that battery temperature Tb can be specified. The map for specifying the relaxation coefficient α' can be stored in the memory 300a.

The generation term $\Delta Ce^{generation}$ can be calculated, for example, based on the following expression (6). It should be noted that the expression for calculating the generation term $\Delta Ce^{generation}$ is not limited to the following expression (6), and any expression may be used as long as the generation of the ion concentration imbalance in the electrode plane can be specified:

$$\Delta Ce^{generation} = \beta' \times P \times \Delta Ce(t) \times \Delta t \quad (6)$$

In the expression (6), ΔCe represents the ion concentration imbalance at the time t (previous time), P represents a surface pressure of the secondary battery 1, and Δt represents the cycle time. According to the expression (6), the generation term $\Delta Ce^{generation}$ depends on the ion concentration imbalance ΔCe, the cycle time Δt, and the surface pressure P.

The surface pressure P can be actually measured or can be estimated with a map previously obtained by experiment or the like. For actually measuring the surface pressure P, a pressure sensor may be placed outside or inside a battery case constituting the exterior of the secondary battery 1. The controller 300 can detect the surface pressure P based on the output from the pressure sensor.

The surface pressure P depends on the value of current Ib flowing through the secondary battery 1, the SOC and the temperature Tb of the secondary battery 1 and the like. Thus, a map representing the correspondence between at least one of the current value Ib, the SOC, and the battery temperature Tb, and the surface pressure P can be previously created. The current value Ib is detected, the SOC is estimated, or the battery temperature Tb is detected, and then the surface pressure P corresponding to at least one of those current value Ib, SOC, and battery temperature Tb can be specified. The map for specifying the surface pressure P can be stored in the memory 300a.

β' represents a generation coefficient. The generation coefficient β' depends on the SOC, the temperature Tb of the secondary battery 1 and the like. Thus, a map representing the correspondence between at least one of the SOC and the battery temperature Tb and the generation coefficient β' can be previously determined. The SOC is estimated or the battery temperature Tb is detected, and then the generation coefficient β' corresponding to at least one of that SOC and that battery temperature Tb can be specified.

With respect to the third state described above, the inter-electrode average ion concentration can be calculated on the basis of the following expression (7):

$$Ce_{ave}(t+\Delta t) = Ce_{ave}(t) - Ce_{ave}^{relaxation} + Ce_{ave}^{generation} \quad (7)$$

In the expression (7), $Ce_{ave}$ represents the average ion concentration, t represents time, and Δt represents the cycle (cycle time) for calculating the average ion concentration $Ce_{ave}$ and is the same as the cycle time Δt described in the above expression (1). As shown in the expression (7), the average ion concentration $Ce_{ave}(t+\Delta t)$ after the elapse of the cycle time Δt is calculated on the basis of the average ion concentration $Ce_{ave}(t)$ at the time t (the previous time).

In the above expression (7), $Ce_{ave}^{relaxation}$ represents a term (reduction term) for reducing the average ion concentration $Ce_{ave}$ during the cycle time Δt. The reduction term $Ce_{ave}^{relaxation}$ is subtracted from the average ion concentration $Ce_{ave}(t)$ at the time t (the previous time). As the reduction term $Ce_{ave}^{relaxation}$ is increased, the average ion concentration $Ce_{ave}(t+\Delta t)$ is reduced.

In the above expression (7), $Ce_{ave}^{generation}$ presents a term (increase term) for increasing the average ion concentration $Ce_{ave}$ during the cycle time Δt. The increase term $Ce_{ave}^{generation}$ is added to the average ion concentration $Ce_{ave}(t)$ at the time t (the previous time). As the increase term $Ce_{ave}^{generation}$ is increased, the average ion concentration $Ce_{ave}(t+\Delta t)$ is increased.

The reduction term $Ce_{ave}^{relaxation}$ can be calculated, for example, based on the following expression (8). It should be noted that the expression for calculating the reduction term $Ce_{ave}^{relaxation}$ is not limited to the following expression (8), and any expression may be used as long as the reduction of the inter-electrode average ion concentration $Ce_{ave}$ can be specified:

$$Ce_{ave}^{relaxation} = \alpha'' \times Ce^{ave}(t) \times \Delta t \tag{8}$$

In the expression (8), $Ce_{ave}(t)$ represents the average ion concentration at the time t (previous time) and $\Delta t$ represents the cycle time. According to the above expression (8), the reduction term $Ce_{ave}^{relaxation}$ depends on the average ion concentration $Ce_{ave}(t)$ and the cycle time $\Delta t$.

$\alpha''$ represents a reduction coefficient. The reduction coefficient $\alpha''$ depends on the SOC, the temperature Tb of the secondary battery 1 and the like. The correspondence (map) between at least one of the SOC and the battery temperature Tb and the reduction coefficient $\alpha''$ can be previously determined by experiment or the like. The SOC is estimated or the battery temperature Tb is detected, and then the reduction coefficient $\alpha''$ corresponding to at least one of that SOC and that battery temperature Tb can be specified. The map for specifying the reduction coefficient $\alpha''$ can be stored in the memory 300a.

The increase term $Ce_{ave}^{generation}$ can be calculated, for example, based on the following expression (9). It should be noted that the expression for calculating the increase term $Ce_{ave}^{generation}$ is not limited to the following expression (9), and any expression may be used as long as the increase of the inter-electrode average ion concentration $Ce_{ave}$ can be specified:

$$Ce_{ave}^{generation} \beta'' \times P \times Ce_{ave}(t) \times \Delta t \tag{9}$$

In the expression (9), $Ce_{ave}$ represents the average ion concentration at the time t (previous time), $\Delta t$ represents the cycle time, and P represents the surface pressure of the secondary battery 1. As described in the expression (6), the surface pressure P can be actually measured or can be estimated with the map previously obtained by experiment or the like. According to the expression (9), the increase term $Ce_{ave}^{generation}$ depends on the average ion concentration $Ce_{ave}$, the cycle time $\Delta t$, and the surface pressure P.

$\beta''$ represents an increase coefficient. The increase coefficient $\beta''$ depends on the SOC, the temperature Tb of the secondary battery 1 and the like. A map representing the correspondence between at least one of the SOC and the battery temperature Tb and the increase coefficient $\beta''$ can be previously determined. The SOC is estimated or the battery temperature Tb is detected, and then the increase coefficient $\beta''$ corresponding to at least one of that SOC and that battery temperature Tb can be specified. The map used for specifying the increase coefficient $\beta''$ can be stored in the memory 300a.

When the ion concentration imbalances dCe, $\Delta Ce$ and the average ion concentration $Ce_{ave}$ are calculated as described above, a deterioration value D of the secondary battery 1 can be calculated on the basis of these calculated values. The deterioration value D is a parameter which specifies the deterioration state of the secondary battery 1. As the deterioration of the secondary battery 1 proceeds, the deterioration value D increases.

The deterioration value D can be calculated by using at least one of the ion concentration imbalances dCe, $\Delta Ce$ and the average ion concentration $Ce_{ave}$. For example, the deterioration value D can be calculated with one of the following expressions (10) to (15):

$$D(t) = Ce_{ave}(t) \times k_1 \tag{10}$$

$$D(t) = \Delta Ce \times k_2 \tag{11}$$

$$D(t) = dCe \times k_3 \tag{12}$$

$$D(t) = Ce_{ave}(t) \times k_1 + \Delta Ce \times k_2 \tag{13}$$

$$D(t) = Ce_{ave}(t) \times k_1 + dCe \times k_3 \tag{14}$$

$$D(t) = k_1 \times Ce_{ave}(t) + k_2 \times \Delta Ce(t) + k_3 \times dCe(t) \tag{15}$$

In each of the expressions (10) to (15), D(t) represents the deterioration value D at the time t. The expression (10) is an expression for calculating the deterioration value D from the average ion concentration $Ce_{ave}$. A conversion coefficient k1 shown in the expression (10) represents a value used for converting the average ion concentration $Ce_{ave}$ into the deterioration value D.

The expression (11) is an expression for calculating the deterioration value D from the ion concentration imbalance $\Delta Ce$ in the electrode plane. A conversion coefficient k2 shown in the expression (11) represents a value used for converting the ion concentration imbalance $\Delta Ce$ in the electrode plane into the deterioration value D. The expression (12) is an expression for calculating the deterioration value D from the inter-electrode ion concentration imbalance dCe. A conversion coefficient k3 shown in the expression (12) represents a value used for converting the inter-electrode ion concentration imbalance dCe into the deterioration value D.

The expression (13) is an expression for calculating the deterioration value D from the average ion concentration $Ce_{ave}$ and the ion concentration imbalance $\Delta Ce$. Conversion coefficients k1 and k2 shown in the expression (13) correspond to the conversion coefficients described in the expressions (10) and (11), respectively. The expression (14) is an expression for calculating the deterioration value D from the average ion concentration $Ce_{ave}$ and the ion concentration imbalance dCe. Conversion coefficients $k_1$ and k3 shown in the expression (14) correspond to the conversion coefficients described in the expressions (10) and (12), respectively.

The expression (15) is an expression for calculating the deterioration value D from the average ion concentration $Ce_{ave}$ and the ion concentration imbalances $\Delta Ce$ and dCe. Conversion coefficients k1, k2, and k3 shown in the expression (15) correspond to the conversion coefficients described in the expressions (10) to (12), respectively.

In general, the average ion concentration $Ce_{ave}$ and the ion concentration imbalance $\Delta Ce$ change over a longer term than the ion concentration imbalance dCe does. For predicting long-term performance (deterioration) of the secondary battery 1, at least one of the average ion concentration $Ce_{ave}$ and the ion concentration imbalance $\Delta Ce$ can be used to calculate the deterioration value D.

For predicting short-term performance (deterioration) of the secondary battery 1, only the ion concentration imbalance dCe can be used to calculate the deterioration value D. In this manner, the average ion concentration $Ce_{ave}$, the ion concentration imbalance $\Delta Ce$ or dCe can be selected as appropriate for the term in the prediction of the performance (deterioration) of the secondary battery 1 to calculate the deterioration value D.

Figure 6:
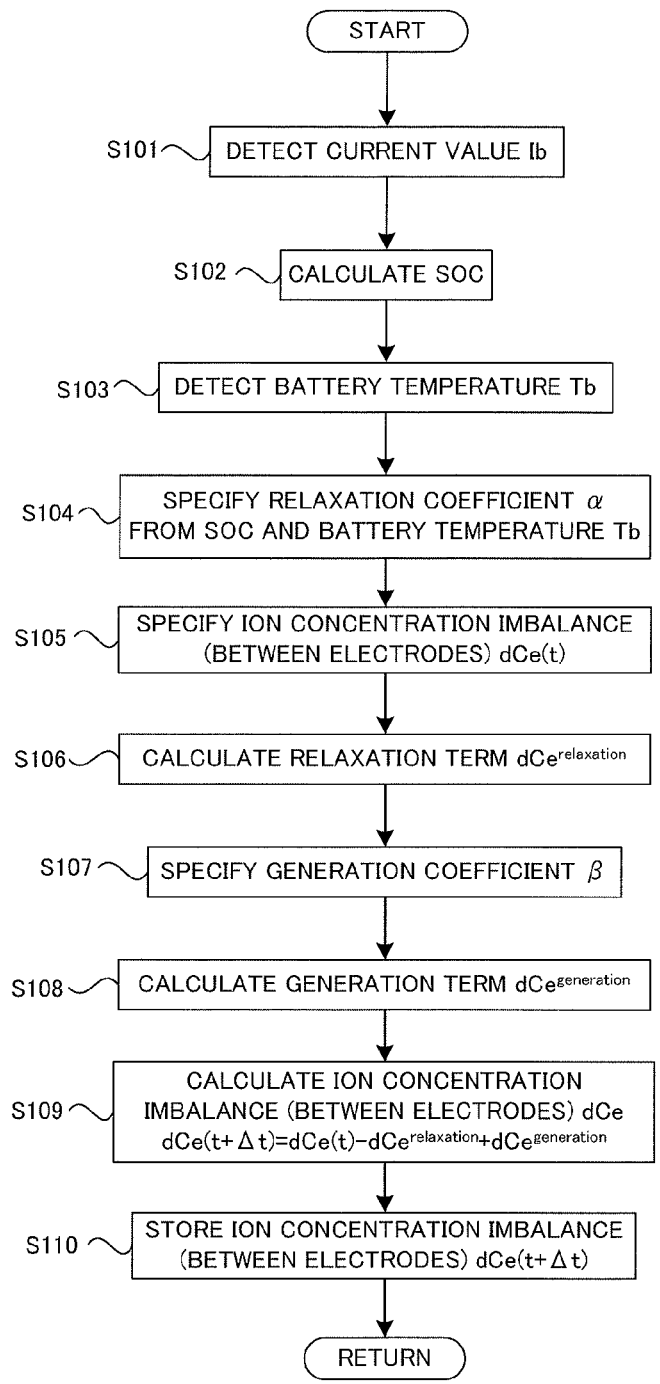
FIG. 6 is a flow chart showing the processing of calculating the ion concentration imbalance between the electrodes.

Next, description is made of the processing of calculating the inter-electrode ion concentration imbalance dCe with reference to a flowchart shown in FIG. 6. The processing shown in FIG. 6 is performed periodically, once in the cycle time $\Delta t$ described above. The processing shown in FIG. 6 is performed by the controller 300.

At step S101, the controller 300 detects the current value Ib of the secondary battery 1 based on the output from the current sensor 202. At step S202, the controller 300 calculates the SOC of the secondary battery 1. The calculation of the SOC can be performed with a known method as appropriate.

For example, the SOC of the secondary battery 1 can be calculated by summing the current values Ib when the secondary battery 1 is charged and discharged. Alternatively, the SOC of the secondary battery 1 can be specified by measuring the Open Circuit Voltage (OCV) of the secondary battery 1. The OCV and the SOC have a correspondence, and the correspondence can be previously determined. Once the OCV is measured, the SOC corresponding to that OCV can be specified.

At step S103, the controller 300 detects the temperature Tb of the secondary battery 1 based on the output from the temperature sensor 203. At step S104, the controller 300 specifies the relaxation coefficient $\alpha$ based on the SOC and the battery temperature Tb. The controller 300 can use the map stored in the memory 300a to specify the relaxation coefficient $\alpha$ corresponding to the SOC and the battery temperature Tb. The value calculated in the processing at step S102 is used as the SOC, and the value detected in the processing at step S103 is used as the battery temperature Tb.

At step S105, the controller 300 specifies the ion concentration imbalance dCe(t) at the time t (previous time). In the present embodiment, each time the cycle time $\Delta t$ elapses, the ion concentration imbalance dCe is calculated and is stored in the memory 300a. This allows the controller 300 to read the ion concentration imbalance dCe (t) at the time t (previous time) from the memory 300a.

At step S106, the controller 300 calculates the relaxation term $dCe_{relaxation}$. Specifically, the controller 300 can calculate the relaxation term $dCe^{relaxation}$ based on the above expression (2). The value specified in the processing at step S104 is used as the relaxation coefficient $\alpha$ used in the expression (2). The value specified in the processing at step S105 is used as the ion concentration imbalance dCe(t) used in the expression (2).

At step S107, the controller 300 specifies the generation coefficient $\beta$. Specifically, the controller 300 uses the map stored in the memory 300a to specify the generation coefficient $\beta$ corresponding to the SOC and the battery temperature Tb. The value calculated in the processing at step S102 is used as the SOC, and the value detected in the processing at step S103 is used as the battery temperature Tb.

At step S108, the controller 300 calculates the generation term $dCe^{generation}$. Specifically, the controller 300 calculates the generation term $dCe^{generation}$ based on the above expression (3). The value detected in the processing at step S101 is used as the current value Ib used in the expression (3). The value specified in the processing at step S107 is used as the generation term $\beta$ used in the expression (3).

At step S109, the controller 300 calculates the ion concentration imbalance dCe(t+$\Delta t$) at the present time. Specifically, the controller 300 can calculate the ion concentration imbalance dCe(t+$\Delta t$) based on the above expression (1). The value specified in the processing at step S105 is used as the ion concentration imbalance dCe(t) used in the expression (1). The value calculated in the processing at step S106 is used as the relaxation term $dCe^{relaxation}$. The value calculated in the processing at step S108 is used as the generation term $dCe^{generation}$.

At step S110, the controller 300 stores the ion concentration imbalance dCe(t+$\Delta t$) calculated in the processing at step S109 into the memory 300a. The ion concentration imbalance dCe(t+$\Delta t$) stored in the memory 300a is used for calculating the ion concentration imbalance dCe in the next processing. In other words, the ion concentration imbalance dCe(t+$\Delta t$) stored in the memory 300a is used next time the processing at step S105 is performed.

Next, description is made of the processing of calculating the ion concentration imbalance $\Delta Ce$ in the electrode plane with reference to a flow chart shown in FIG. 7. The processing shown in FIG. 7 is performed each time the cycle time $\Delta t$ elapses. The processing shown in FIG. 7 is performed by the controller 300.

The processing from step S201 to step S203 is identical to the processing from step S101 to step S103 shown in FIG. 6. At step S204, the controller 300 calculates the surface pressure P of the secondary battery 1. The calculation of the surface pressure P is performed as described above.

In the present embodiment, the calculation of the surface pressure P is performed by using the values detected in the processing at steps S201 and S203 (current value Ib and battery temperature Tb) and the SOC calculated in the processing at step S202. Alternatively, the pressure sensor can be used to measure the surface pressure P. In this case, the processing at step S201 can be omitted.

At step S205, the controller 300 specifies the relaxation coefficient $\alpha'$ based on the SOC and the battery temperature Tb. The controller 300 can use the map stored in the memory 300a to specify the relaxation coefficient $\alpha'$ corresponding to the SOC and the battery temperature Tb. The value calculated in the processing at step S202 is used as the SOC, and the value detected in the processing at step S203 is used as the battery temperature Tb.

At step S206, the controller 300 specifies the ion concentration imbalance $\Delta Ce(t)$ at the time t (previous time). In the present embodiment, each time the cycle time $\Delta t$ elapses, the ion concentration imbalance $\Delta Ce$ is calculated and is stored in the memory 300a. This allows the controller 300 to read the ion concentration imbalance $\Delta Ce$ (t) at the time t (previous time) from the memory 300a.

At step S207, the controller 300 calculates the relaxation term $\Delta Ce^{relaxation}$. Specifically, the controller 300 can calculate the relaxation term $\Delta Ce^{relaxation}$ based on the above expression (5). The value specified in the processing at step S205 is used as the relaxation coefficient $\alpha'$ used in the expression (5). The value specified in the processing at step S206 is used as the ion concentration imbalance $\Delta Ce(t)$ used in the expression (5).

At step S208, the controller 300 specifies the generation coefficient $\beta'$. Specifically, the controller 300 uses the map stored in the memory 300a to specify the generation coefficient $\beta'$ corresponding to the SOC and the battery temperature Tb. The value calculated in the processing at step S202 is used as the SOC, and the value detected in the processing at step S203 is used as the battery temperature Tb.

At step S209, the controller 300 calculates the generation term $\Delta Ce^{generation}$. Specifically, the controller 300 calculates the generation term $\Delta Ce^{generation}$ based on the above expression (6). The value calculated in the processing at step S204 is used as the surface pressure P used in the expression (6). The value specified in the processing at step S206 is used as the ion concentration imbalance $\Delta Ce(t)$ used in the expression (6). The value specified in the processing at step S208 is used as the generation coefficient $\beta'$ used in the expression (6).

At step S210, the controller 300 calculates the ion concentration imbalance $\Delta Ce(t+\Delta t)$ at the present time. Specifically, the controller 300 can calculate the ion concentration imbalance $\Delta Ce(t+\Delta t)$ based on the above expression (4). The value specified in the processing at step S206 is used as the ion concentration imbalance $\Delta Ce(t)$ used in the expression (4). The value calculated in the processing at step S207 is used as the relaxation term $\Delta Ce^{relaxation}$. The value calculated in the processing at step S209 is used as the generation term $\Delta Ce^{generation}$.

At step S211, the controller 300 stores the ion concentration imbalance $\Delta Ce(t+\Delta t)$ calculated in the processing at step S210 into the memory 300a. The ion concentration imbalance $\Delta Ce(t+\Delta t)$ stored in the memory 300a is used for calculating the ion concentration imbalance $\Delta Ce$ in the next processing. In other words, the ion concentration imbalance $\Delta Ce(t+\Delta t)$ stored in the memory 300a is used next time the processing at step S206 is performed.

Figure 8:
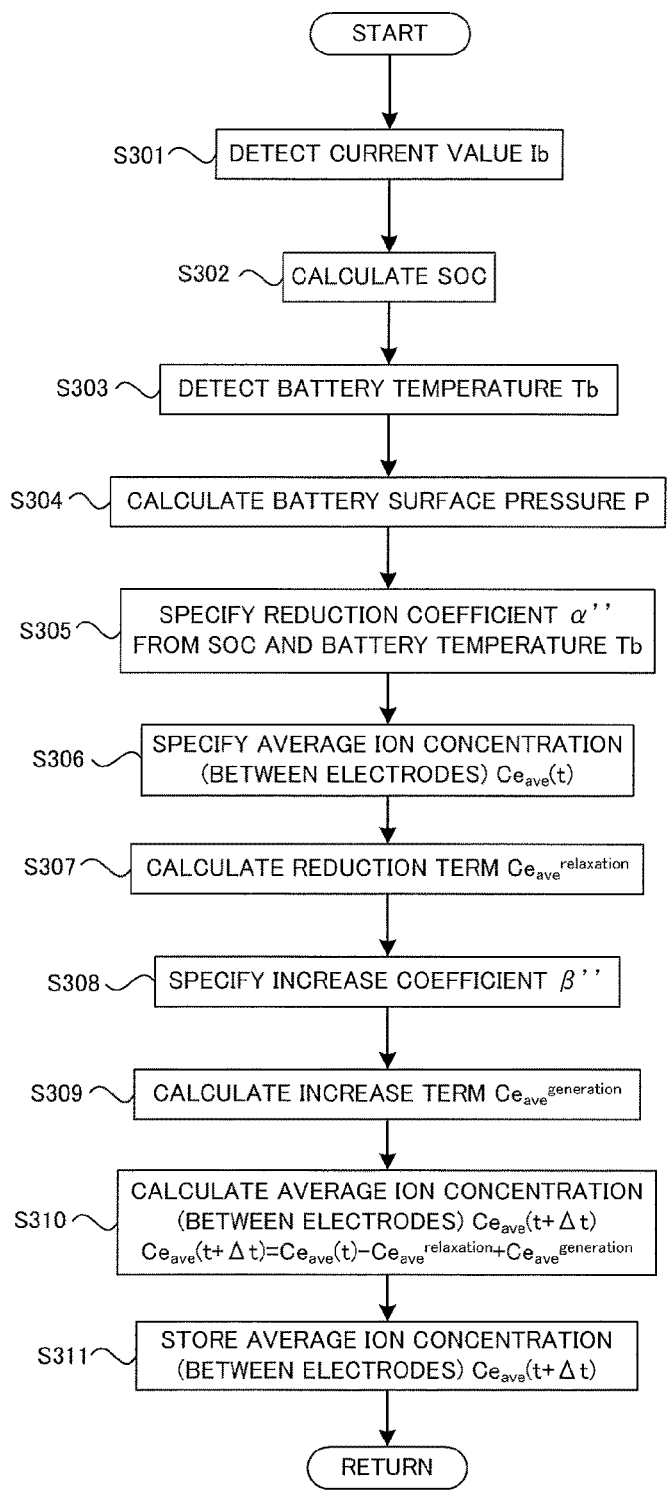
FIG. 8 is a flow chart showing the processing of calculating the average ion concentration between the electrodes.

Next, description is made of the processing of calculating the inter-electrode average ion concentration $Ce_{ave}$ with reference to a flow chart shown in FIG. 8. The processing shown in FIG. 8 is performed each time the cycle time $\Delta t$ elapses. The processing shown in FIG. 8 is performed by the controller 300.

The processing from step S301 to step S304 is identical to the processing from step S201 to step S204 shown in FIG. 7. At step S305, the controller 300 calculates the reduction coefficient $\alpha''$ based on the SOC and the battery temperature Tb.

The controller 300 can use the map stored in the memory 300a to specify the reduction coefficient $\alpha''$ corresponding to the SOC and the battery temperature Tb. The value calculated in the processing at step S302 is used as the SOC, and the value detected in the processing at step S303 is used as the battery temperature Tb.

At step S306, the controller 300 specifies the average ion concentration $Ce_{ave}(t)$ at the time t (previous time). In the present embodiment, each time the cycle time $\Delta t$ elapses, the average ion concentration $Ce_{ave}$ is calculated and is stored in the memory 300a. This allows the controller 300 to read the average ion concentration $Ce_{ave}(t)$ at the time t (previous time) from the memory 300a.

At step S307, the controller 300 calculates the reduction term $Ce_{ave}^{relaxation}$. Specifically, the controller 300 can calculate the reduction term $Ce_{ave}^{relaxation}$ based on the above expression (8). The value specified in the processing at step S305 is used as the reduction coefficient $\alpha''$ used in the expression (8). The value specified in the processing at step S306 is used as the average ion concentration $Ce_{ave}(t)$ used in the expression (8).

At step S308, the controller 300 specifies the increase coefficient $\beta''$. Specifically, the controller 300 uses the map stored in the memory 300a to specify the increase coefficient $\beta''$ corresponding to the SOC and the battery temperature Tb. The value calculated in the processing at step S302 is used as the SOC, and the value detected in the processing at step S303 is used as the battery temperature Tb.

At step S309, the controller 300 calculates the increase term $Ce_{ave}^{generation}$. Specifically, the controller 300 calculates the increase term $Ce_{ave}^{generation}$ based on the above expression (9). The value calculated in the processing at step S304 is used as the surface pressure P used in the expression (9). The value specified in the processing at step S306 is used as the average ion concentration $Ce_{ave}(t)$ used in the expression (9). The value specified in the processing at step S308 is used as the increase coefficient $\beta''$ used in the expression (9).

At step S310, the controller 300 calculates the average ion concentration $Ce_{ave}(t+\Delta t)$ at the present time. Specifically, the controller 300 can calculate the average ion concentration $Ce_{ave}(t+\Delta t)$ based on the above expression (7). The value specified in the processing at step S306 is used as the average ion concentration $Ce_{ave}(t)$ used in the expression (7). The value calculated in the processing at step S307 is used as the reduction term $Ce_{ave}^{relaxation}$. The value calculated in the processing at step S309 is used as the increase term $Ce_{ave}^{generation}$.

At step S311, the controller 300 stores the average ion concentration $Ce_{ave}(t+\Delta t)$ calculated in the processing at step S310 into the memory 300a. The average ion concentration $Ce(t+\Delta t)$ stored in the memory 300a is used for calculating the average ion concentration $Ce_{ave}$ in the next processing. In other words, the average ion concentration $Ce_{ave}(t+\Delta t)$ stored in the memory 300a is used next time the processing at step S306 is performed.

Figure 9:
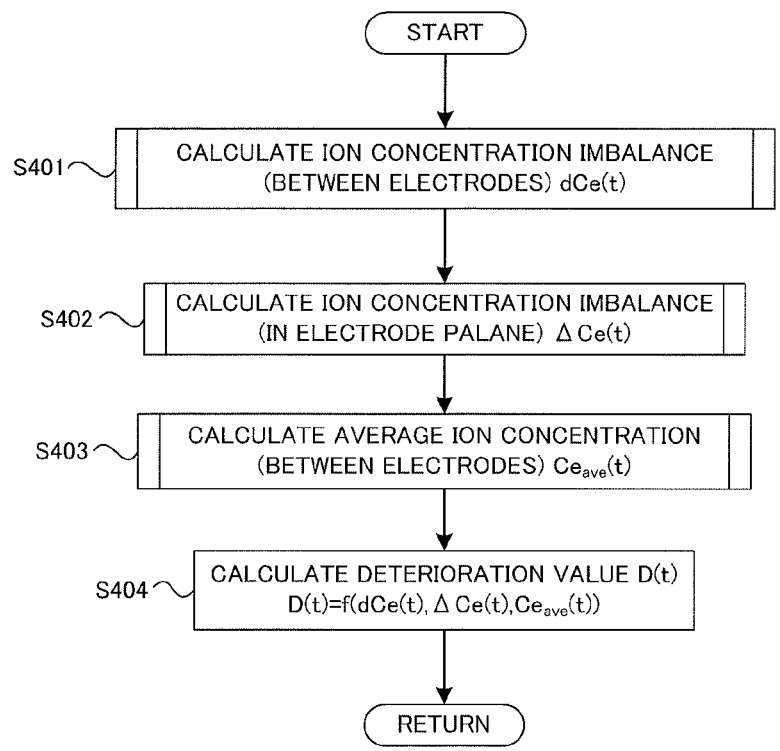
FIG. 9 is a flow chart showing the processing of calculating a deterioration value.

Next, description is made of the processing of calculating the deterioration value D with reference to a flow chart shown in FIG. 9. The processing shown in FIG. 9 is performed each time the cycle time $\Delta t$ elapses. The processing shown in FIG. 9 is performed by the controller 300.

At step S401, the controller 300 calculates the inter-electrode ion concentration imbalance $dCe(t)$. The processing at step S401 corresponds to the processing shown in FIG. 6. At step S402, the controller 300 calculates the ion concentration imbalance $\Delta Ce(t)$ in the electrode plane. The processing at step S402 corresponds to the processing shown in FIG. 7.

At step S403, the controller 300 calculates the inter-electrode average ion concentration $Ce(t)$. The processing at step S403 corresponds to the processing shown in FIG. 8. At step S404, the controller 300 calculates the deterioration value $D(t)$ based on the ion concentration imbalances $dCe(t)$ and $\Delta Ce(t)$ and the average ion concentration $Ce_{ave}(t)$ calculated in the processing from step S401 to step S403. Specifically, the controller 300 calculates the deterioration value $D(t)$ based on the above expression (13).

Figure 10:
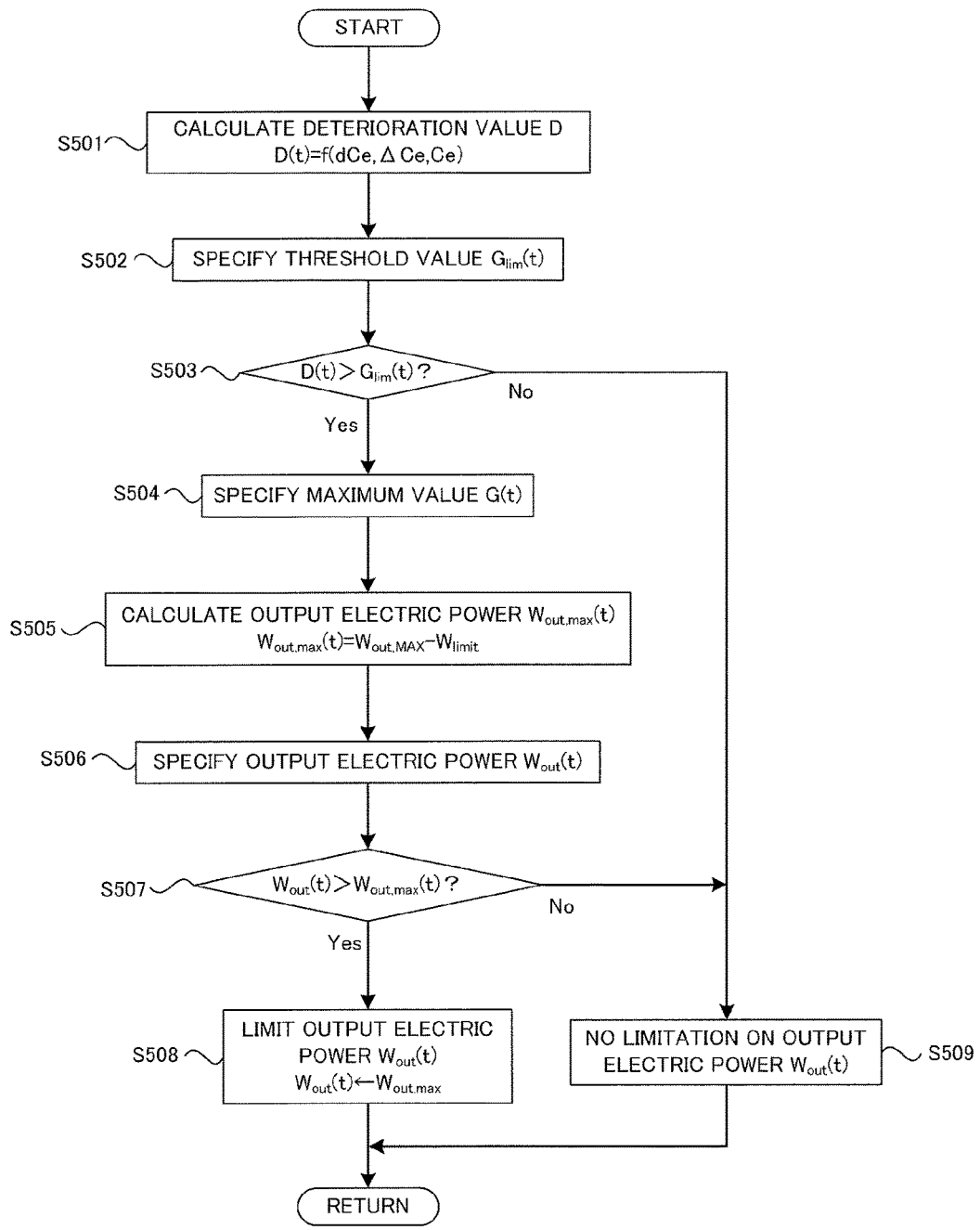
FIG. 10 is a flow chart showing the processing of controlling the output from the secondary battery.

After the calculation of the deterioration value $D(t)$, the controller 300 can control the input to and output from the secondary battery 1 based on the deterioration value $D(t)$. Next, the processing of controlling the output from the secondary battery 1 is described with reference to a flow chart shown in FIG. 10. The processing shown in FIG. 10 is performed by the controller 300.

At step S501, the controller 300 calculates the deterioration value $D(t)$ in the secondary battery 1 at the present time. The processing at step S501 corresponds to the processing shown in FIG. 9. At step S502, the controller 300 specifies a threshold value $G_{lim}(t)$ at the present time t.

Figure 11:
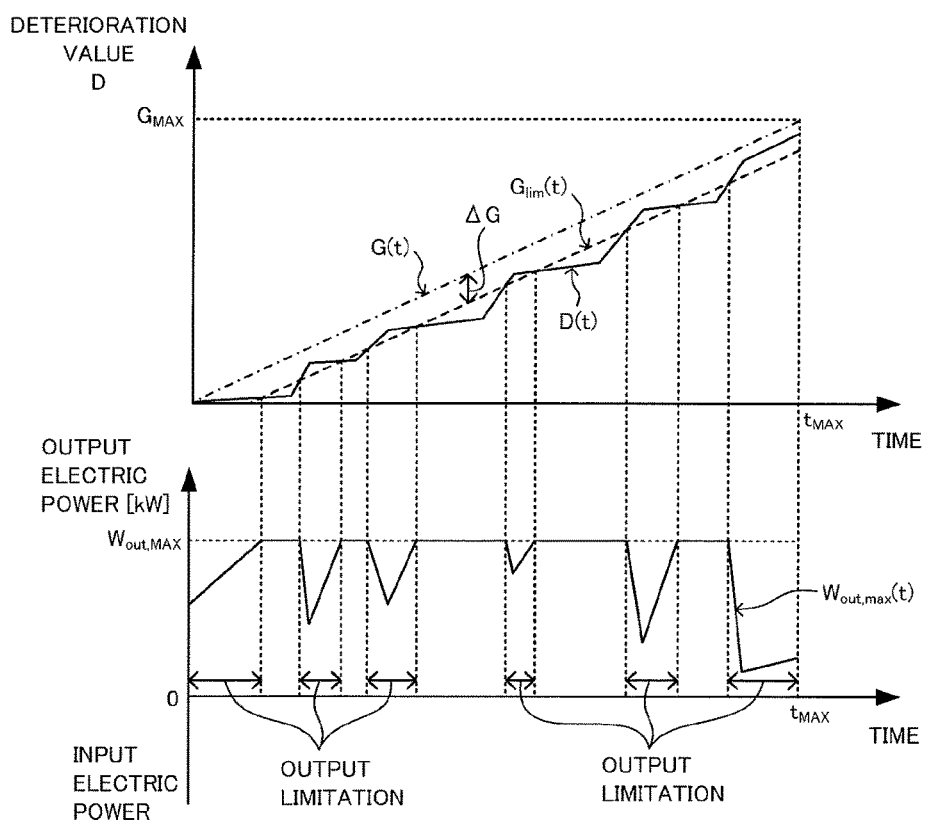
FIG. 11 is a diagram showing changes in the deterioration value and output electric power when the output from the secondary battery is controlled.

The threshold value $G_{lim}(t)$ is now described with reference to FIG. 11. The vertical axis shown in FIG. 11 represents the deterioration value D and the output electric power from the secondary battery 1. The horizontal axis shown in FIG. 11 represents time. $G_{MAX}$ represents the maximum value of the deterioration value D allowed in the secondary battery 1. In other words, the deterioration value $G_{MAX}$ represents the deterioration value D when the internal resistance of the secondary battery 1 is at the maximum allowable value.

The charge and discharge of the secondary battery 1 can be controlled such that the deterioration value D reaches the deterioration value $G_{MAX}$ when the secondary battery 1 reaches the end of its life. The life of the secondary battery 1 can be defined as a time $t_{MAX}$. The time t represents the elapsed time since the first use of the secondary battery 1. The secondary battery 1 reaches the end of its life when the elapsed time reaches the time $t_{MAX}$.

A maximum value $G(t)$ is the maximum allowable value of the deterioration value D at a time t. The maximum value $G(t)$ is determined on the basis of the deterioration value $G_{MAX}$ and the time $t_{MAX}$. In FIG. 11, the maximum value $G(t)$ is determined from a straight line (chain line) connecting a deterioration value D at a time zero with the deterioration value $G_{MAX}$ at the time $t_{MAX}$. According to the chain line shown in FIG. 11, the time t and the maximum value $G(t)$ have a proportional relationship.

Although the maximum value $G(t)$ is determined from the chain line (straight line) shown in FIG. 11 in the present embodiment, the present invention is not limited thereto. The locus shown by the chain line in FIG. 11 can be set as appropriate by considering the use state of the secondary battery 1 and the like. Specifically, the chain line specifying the maximum value $G(t)$ may be a curved line instead of the straight line.

The threshold value $G_{lim}(t)$ is a value smaller than the maximum value $G(t)$ by a predetermined amount $\Delta G$. The output from the secondary battery 1 may be controlled with respect to the maximum value $G(t)$, but in this case, the deterioration value $D(t)$ may be larger than the maximum value $G(t)$ due to delayed control or the like. To address this, in the present embodiment, the output from the secondary battery 1 is controlled with respect to the threshold value $G_{lim}(t)$ smaller than the maximum value $G(t)$. This can prevent the deterioration value $D(t)$ from reaching the maximum value $G(t)$ even when the deterioration value $D(t)$ is larger than the threshold value $G_{lim}(t)$.

The difference $\Delta G$ between the maximum value $G(t)$ and the threshold value $G_{lim}(t)$ can be set as appropriate. Alternatively, the output from the secondary battery 1 may be controlled with respect to the maximum value $G(t)$.

As described above, the threshold value $G_{lim}(t)$ is preset on the basis of the maximum value $G(t)$. The information about the threshold value $G_{lim}(t)$ can be stored in the memory 300a in advance. The controller 300 can measure the present time t and specify the threshold value $G_{lim}(t)$ corresponding to the measured time t. The present time t is the elapsed time since the first use of the secondary battery 1 and can be measured with a timer. In the processing at step S502, the threshold value $G_{lim}(t)$ is specified as described above.

At step S503, the controller 300 determines whether or not the deterioration value $D(t)$ calculated in the processing at step S501 is larger than the threshold value $G_{lim}(t)$ specified in the processing at step S502. When the deterioration value $D(t)$ is larger than the threshold value $G_{lim}(t)$, the controller 300 performs processing at step S504. When the deterioration value $D(t)$ is smaller than the threshold value $G_{lim}(t)$, the controller 300 performs processing at step S509.

When the deterioration value $D(t)$ is larger than the threshold value $G_{lim}(t)$, the controller 300 determines that the output from the secondary battery 1 needs to be limited, and performs the processing at step S504 and the subsequent steps. The limitation of the output from the secondary battery 1 can cause the deterioration value $D(t)$ to fall below the threshold value $G_{lim}(t)$.

The limitation of the output from the secondary battery 1 can reduce the deterioration value $D(t)$. As described above, the deterioration value $D(t)$ is calculated on the basis of the average ion concentration Ce and the ion concentration imbalances dCe and $\Delta$Ce. The limitation of the output from the secondary battery 1 can reduce a lowering of the average ion concentration $Ce_{ave}$ and can reduce the ion concentration imbalances dCe and $\Delta$Ce. As a result, the deterioration value $D(t)$ can be reduced.

At step S504, the controller 300 specifies the maximum value $G(t)$ at the present time t. As described above, the maximum value $G(t)$ is preset on the basis of the deterioration value $G_{MAX}$ and the time $t_{MAX}$. The information about the maximum value $G(t)$ can be stored in the memory 300a in advance. In other words, the correspondence between the elapsed time t since the first use of the secondary battery 1 and the maximum value $G(t)$ can be stored in the memory 300a. The controller 300 can measure the time t up to the present and specify the maximum value $G(t)$ corresponding to the present time t.

At step S505, the controller 300 calculates a maximum output electric power $W_{out,max}(t)$ allowable at the time t. The output electric power $W_{out,max}(t)$ is calculated on the basis of the following expression (16):

$$W_{out,max}(t) = W_{out,MAX} - W_{limit}$$

$$D(t) > G_{limit}(t) \tag{16}$$

In the above expression (16), $W_{out,MAX}$ represents a maximum electric power value obtained when the secondary battery 1 is discharged. The output electric power $W_{out,MAX}$ is preset on the basis of the output characteristics of the secondary battery 1. The information about the output electric power $W_{out,MAX}$ can be stored in the memory 300a in advance. $W_{limit}$ represents an electric power amount used when the output from the secondary battery 1 is limited. As obvious from the expression (16), when the output from the secondary battery 1 is limited, the output electric power $w_{out,max}(t)$ is lower than the output electric power $W_{out,MAX}$ by the limiting electric power amount $W_{limit}$.

The limiting electric power amount $W_{limit}$ can be calculated, for example, based on the following expression (17):

$$W_{limit}(t) = k \times (D(t) - G_{limit}(t))$$

$$D(t) > G_{limit}(t) \tag{17}$$

In the expression (17), $D(t)$ represents the deterioration value at the time t, $G_{limit}(t)$ represents the threshold value (deterioration value) at the time t, k represents a weighting coefficient and can be set as appropriate. The weighting coefficient k can be stored in the memory 300a in advance.

According to the expression (17), the limiting electric power amount $W_{limit}$ is determined in accordance with the difference between the threshold value $G_{limit}(t)$ and the deterioration value $D(t)$. This determination of the limiting electric power amount $W_{limit}$ can incorporate the difference between the threshold value $G_{limit}(t)$ and the deterioration value $D(t)$ into the processing of limiting the output from the secondary battery 1. Specifically, as the difference between the deterioration value $D(t)$ and the threshold value $G_{limit}(t)$ is increased, the limiting electric power amount $W_{limit}$ is increased to limit the output from the secondary battery 1 to a larger extent. In other words, as the difference between the deterioration value $D(t)$ and the threshold value $G_{limit}(t)$ is reduced, the limiting electric power amount $W_{limit}$ is reduced to limit the output from the secondary battery 1 to a lesser extent.

At step S506, the controller 300 specifies an output electric power $W_{out}(t)$ required of the secondary battery 1. For example, the required output electric power $W_{out}(t)$ is increased as an accelerator pedal of the vehicle is pressed more. At step S507, the controller 300 determines whether or not the output electric power $W_{out}(t)$ specified in the processing at step S506 is higher than the output electric power $W_{out,max}(t)$ calculated in the processing at step S505.

When the output electric power $W_{out}(t)$ is higher than the output electric power $W_{out,max}(t)$, the controller 300 performs processing at step S508. When the output electric power $W_{out}(t)$ is lower than the output electric power $W_{out,max}(t)$, the controller 300 performs processing at step S509. At step S508, the controller 300 sets an actual output electric power $W_{out}(t)$ of the secondary battery 1 at the output electric power $W_{out,max}(t)$.

When the controller 300 proceeds from the processing at step S507 to the processing at step S508, the required output electric power $W_{out}(t)$ is higher than the output electric power $W_{out,max}(t)$. In the processing at step S508, the actual output electric power $W_{out}(t)$ of the secondary battery 1 is set at the output electric power $W_{out,max}(t)$ to cause the actual output electric power $W_{out}(t)$ to be lower than the required output electric power $W_{out}(t)$. In other words, the output from the secondary battery 1 is limited.

At step S509, the controller 300 sets the required output electric power $W_{out}(t)$ as the actual output electric power $W_{out}(t)$ of the secondary battery 1. When the controller 300 proceeds from the processing at step S507 to the processing at step S509, the required output electric power $W_{out}(t)$ is lower than the output electric power $W_{out,max}(t)$. The output electric power $W_{out,max}(t)$ is the maximum output electric power determined by factoring in the deterioration value $D(t)$.

Thus, when the required output electric power $W_{out}(t)$ is lower than the output electric power $W_{out,max}(t)$, the required output electric power $W_{out}(t)$ can be set as the actual output electric power $W_{out}(t)$ of the secondary battery 1. In this manner, the output from the secondary battery 1 is not limited in the processing at step S509.

The output from the secondary battery 1 is not limited either when the controller 300 proceeds from the processing at step S503 to the processing at step S509. When the controller 300 proceeds from the processing at step S503 to the processing at step S509, the deterioration value $D(t)$ does not reach the threshold value $G_{limit}(t)$. In this case, a certain increase in the deterioration value $D(t)$ can be allowed, and the limitation of the output from the secondary battery 1 is not required.

FIG. 11 is the diagram (by way of example) showing a change in the deterioration value $D(t)$ and a change in the output electric power $W_{out,max}(t)$ when the processing shown in FIG. 10 is performed. As shown in FIG. 11, when the deterioration value $D(t)$ is larger than the threshold value $G_{limit}(t)$, the output electric power $W_{out,max}(t)$ is lower than the output electric power $W_{out,MAX}$, and the output from the secondary battery 1 is limited.

As described above, the limitation of the output from the secondary battery 1 can reduce the deterioration value $D(t)$. When the deterioration value $D(t)$ is reduced below the threshold value $G_{limit}(t)$ the limitation of the output from the secondary battery 1 is canceled, that is, the output electric power $W_{out,max}(t)$ is set at the output electric power $W_{out,MAX}$. This can achieve the control of the output from the secondary battery 1 while the deterioration of the secondary battery 1 is monitored.

According to the present embodiment, the deterioration value $D(t)$ can be specified on the basis of the average ion concentration $Ce_{ave}(t)$. When the average ion concentration $Ce_{ave}(t)$ is changed, the amount of lithium ions contributing to the charge and discharge of the secondary battery 1 is also changed to easily influence the input/output performance (in other words, the deterioration) of the secondary battery 1. Thus, specifying the deterioration value $D(t)$ on the basis of the average ion concentration $Ce_{ave}(t)$ can provide a clear knowledge of the deterioration state of the secondary battery 1.

When the ion concentration imbalance dCe or the ion concentration imbalance $\Delta Ce$ is factored in to specify the deterioration value $D(t)$ in addition to the average ion concentration $Ce_{ave}(t)$, a clearer knowledge of the deterioration state of the secondary battery 1 can be provided. In other words, the accuracy in estimating the deterioration state of the secondary battery 1 can be enhanced.

When both the ion concentration imbalance dCe and the ion concentration imbalance $\Delta Ce$ are factored in to specify the deterioration value $D(t)$ in addition to the average ion concentration $Ce_{ave}(t)$, a still clearer knowledge of the deterioration state of the secondary battery 1 can be provided. In other words, the accuracy in estimating the deterioration state of the secondary battery 1 can be enhanced further.

Since the accuracy in estimating the deterioration state of the secondary battery 1 can be enhanced, the output control can be performed in accordance with that deterioration state. Specifically, it is possible to prevent excessive limitation of the output from the secondary battery 1 or excessive relaxation of the output from the secondary battery 1. When the excessive output limitation is prevented, the output performance of the secondary battery 1 can be improved. When the excessive output relaxation is prevented, extremely advanced deterioration of the secondary battery 1 can be prevented to extend the life of the secondary battery 1.

According to the present embodiment, the deterioration value $D(t)$ can be changed along the threshold value $G_{limit}(t)$. This allows the secondary battery 1 to be used continuously until the time $t_{MAX}$ when the secondary battery 1 reaches the end of its life.

Although the processing shown in FIG. 10 includes controlling the output from the secondary battery 1 based on which of the deterioration value $D(t)$ and the threshold value $G_{limit}(t)$ is higher, the present invention is not limited thereto. Specifically, the input to the secondary battery 1 can be controlled on the basis of which of the deterioration value $D(t)$ and the threshold value $G_{limit}(t)$ is higher.

Figure 12:
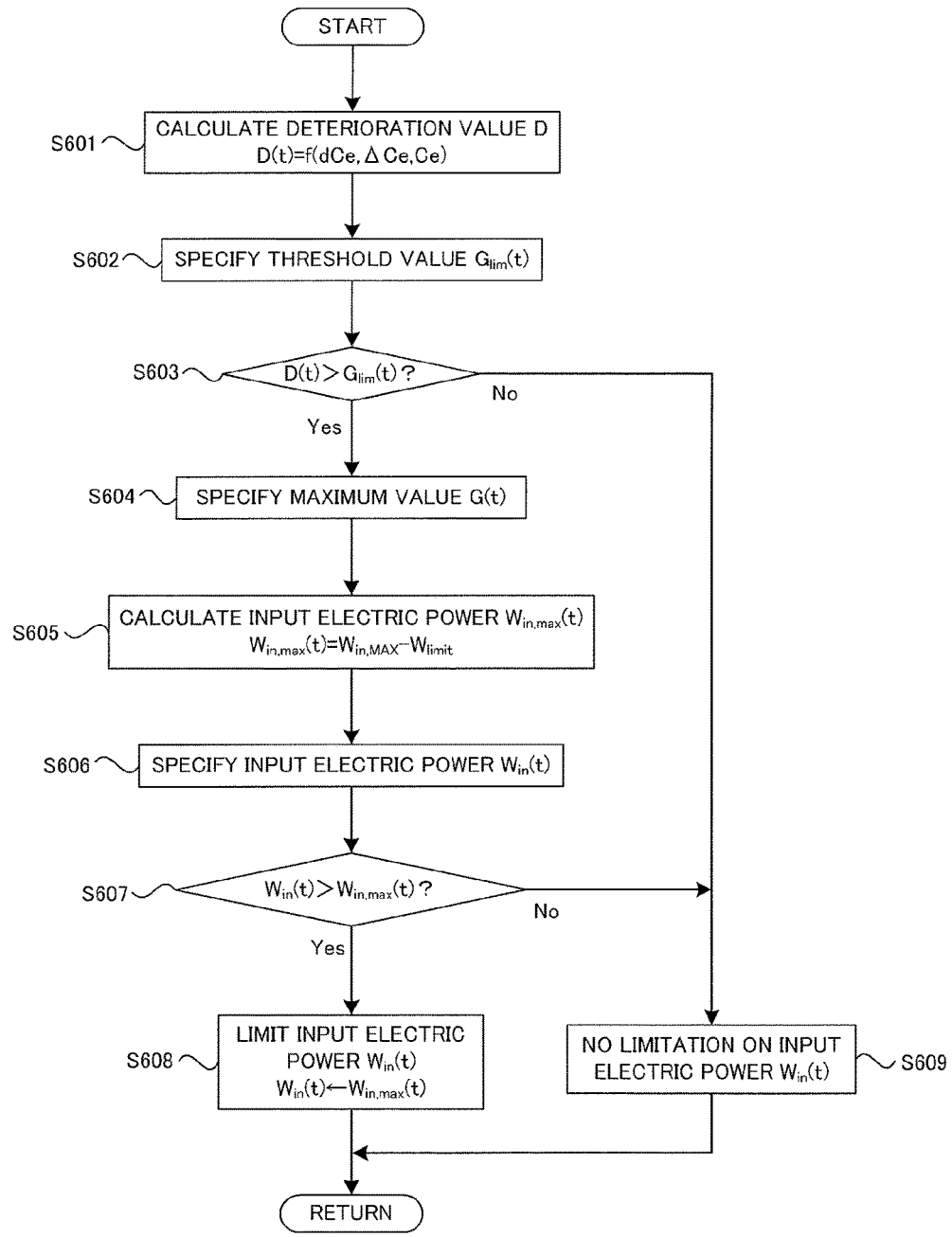
FIG. 12 is a flow chart showing the processing of controlling the input to the secondary battery.

FIG. 12 is a flow chart showing the processing of controlling the input to the secondary battery 1. The processing shown in FIG. 12 is performed by the controller 300.

The processing from step S601 to step S604 is identical to the processing from step S501 to step S504 shown in FIG. 10. The deterioration value $D(t)$ can be calculated on the basis of the ion concentration imbalances dCe, $\Delta Ce$, and the average ion concentration $Ce_{ave}$ obtained when the secondary battery 1 is preferentially charged. The deterioration value $D(t)$ can be calculated on the basis of at least one of the ion concentration imbalances dCe, $\Delta Ce$, and the average ion concentration $Ce_{ave}$.

At step S605, the controller 300 calculates a maximum input electric power $W_{in,max}(t)$ allowable at the time t. The input electric power $W_{in,max}(t)$ is calculated on the basis of the following expression (18):

$$W_{in,max}(t)=W_{in,MAX}-W_{limit}$$

$$D(t)>G_{limit}(t) \tag{18}$$

In the above expression (18), $W_{in,MAX}$ represents a maximum electric power value obtained when the secondary battery 1 is charged. $W_{limit}$ represents an electric power amount when the input to the secondary battery 1 is limited. As obvious from the expression (18), when the input to the secondary battery 1 is limited, the input electric power $W_{in,max}(t)$ is lower than the input electric power $W_{out,MAX}$ by the limiting electric power amount $W_{limit}$. The limiting electric power amount $W_{limit}$ can be determined in accordance with the difference between the threshold value $G_{limit}(t)$ and the deterioration value D(t), similarly to the expression (17).

This determination of the limiting electric power amount $W_{limit}$ can incorporate the difference between the threshold value $G_{limit}(t)$ and the deterioration value D(t) into the processing of limiting the input to the secondary battery 1. Specifically, as the difference between the deterioration value D(t) and the threshold value $G_{limit}(t)$ is increased, the limiting electric power amount $W_{limit}$ is increased to limit the input to the secondary battery 1 to a larger extent. As the difference between the deterioration value D(t) and the threshold value $G_{limit}(t)$ is increased, the limiting electric power amount $W_{limit}$ is reduced to limit the input to the secondary battery 1 to a lesser extent.

At step S606, the controller 300 specifies an electric power $W_{in}(t)$ to be input to the secondary battery 1. At step S607, the controller 300 determines whether or not the input electric power $W_{in}(t)$ specified in the processing at step S606 is higher than the input electric power $W_{in,max}(t)$ calculated in the processing at step S605.

When the input electric power $W_{in}(t)$ is higher than the input electric power $W_{in,max}(t)$, the controller 300 performs processing at step S608. When the input electric power $W_{in}(t)$ is lower than the input electric power $W_{in,max}(t)$, the controller 300 performs processing at step S609. At step S608, the controller 300 sets an actual input electric power $W_{in}(t)$ of the secondary battery 1 at the input electric power $W_{in,max}(t)$.

When the controller 300 proceeds from the processing at step S607 to the processing at step S608, the input electric power $W_{in}(t)$ is higher than the maximum allowable input $W_{in,max}(t)$. In the processing at step S608, the actual input electric power $W_{in}(t)$ of the secondary battery 1 is set at the input electric power $W_{in,max}(t)$ to cause the actual input electric power $W_{in}(t)$ to be lower than the electric power $W_{in}(t)$ to be input. In other words, the input to the secondary battery 1 is limited.

At step S609, the controller 300 sets the electric power $W_{in}(t)$ to be input as the actual input electric power $W_{in}(t)$ of the secondary battery 1. When the controller 300 proceeds from the processing at step S607 to the processing at step S609, the electric power $W_{in}(t)$ to be input is lower than the input electric power $W_{out,max}(t)$. The input electric power $W_{out,max}(t)$ is the maximum input electric power determined by factoring in the deterioration value D(t).

Thus, when the electric power $W_{in}(t)$ to be input is lower than the input electric power $W_{in,max}(t)$, the electric power $W_{out}(t)$ to be input can be set as the actual input electric power $W_{out}(t)$ of the secondary battery 1. In this manner, the input to the secondary battery 1 is not limited in the processing at step S609.

The input to the secondary battery 1 is not limited either when the controller 300 proceeds from the processing at step S603 to the processing at step S609. When the controller 300 proceeds from the processing at step S603 to the processing at step S609, the deterioration value D(t) does not reach the threshold value $G_{limit}(t)$. In this case, a certain increase in the deterioration value D(t) can be allowed, and the limitation of the input to the secondary battery 1 is not required.

Figure 13:
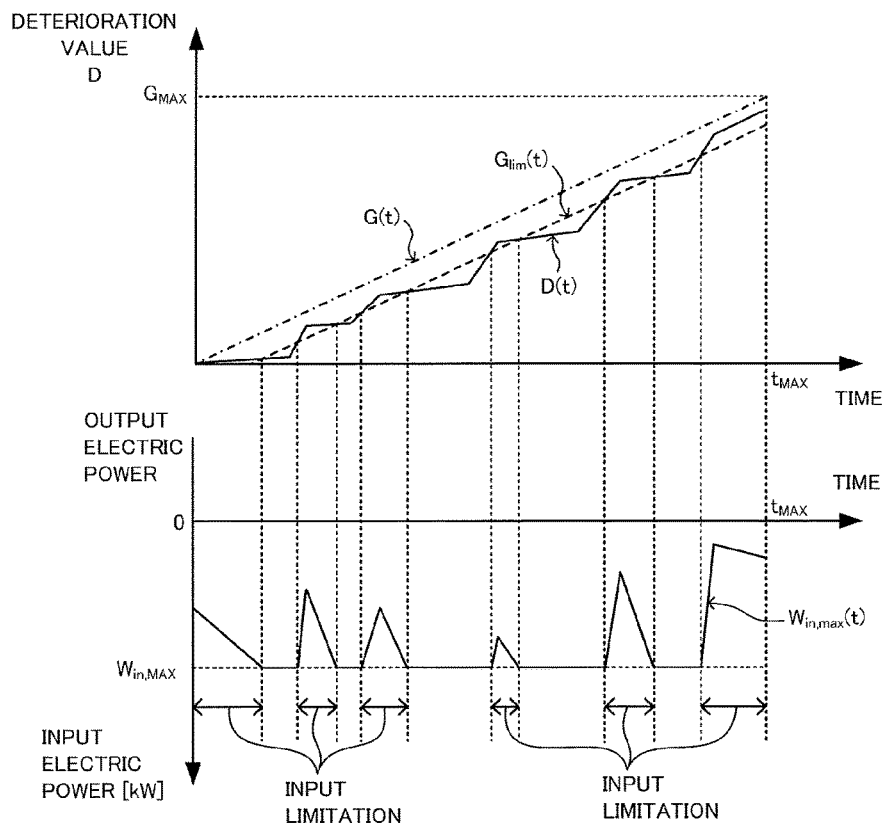
FIG. 13 is a diagram showing changes in the deterioration value and input electric power when the input to the secondary battery is controlled.

FIG. 13 is an diagram (by way of example) showing a change in the deterioration value D(t) and a change in the input electric power $W_{in,max}(t)$ when the processing shown in FIG. 12 is performed. As shown in FIG. 13, when the deterioration value D(t) is larger than the threshold value $G_{limit}(t)$, the input electric power $W_{in,max}(t)$ is lower than the input electric power $W_{in,MAX}$, and the input to the secondary battery 1 is limited.

The limitation of the input to the secondary battery 1 can reduce the deterioration value D(t). As described above, the deterioration value D(t) is calculated on the basis of the average ion concentration Ce and the ion concentration imbalances dCe and ΔCe. The limitation of the input to the secondary battery 1 can reduce a change in the average ion concentration Ce and can reduce the ion concentration imbalances dCe and ΔCe. As a result, the deterioration value D(t) can be reduced.

When the deterioration value D(t) is reduced below the threshold value $G_{limit}(t)$, the limitation of the input to the secondary battery 1 is canceled, that is, the input electric power $W_{in,max}(t)$ is set at the input electric power $W_{in,MAX}$. This can achieve the control of the input to the secondary battery 1 while the deterioration of the secondary battery 1 is monitored.

The processing shown in FIG. 12 allows the control of the input to the secondary battery 1 while a clear knowledge of the deterioration state of the secondary battery 1 can be provided. Specifically, it is possible to prevent excessive limitation of the input to improve the input performance of the secondary battery 1. It is also possible to prevent excessive relaxation of the input to prevent the extremely advanced deterioration of the secondary battery 1. Consequently, the life of the secondary battery 1 can be extended.

Embodiment 2

Embodiment 2 of the present invention will hereinafter be described. In the present embodiment, a battery model, later described, is used to estimate the internal state and the SOC of a secondary battery 1. In the present embodiment, components identical to those described in Embodiment 1 are designated with the same reference numerals, and detailed description thereof is omitted.

First, the battery model used in the present embodiment is described. A basic battery model expression is represented by basic equations including the following expressions (19) to (29). FIG. 14 shows a list of variables and constants used in the battery model expression.

In the variables and constants in the model expression described below, a subscript e means a value in an electrolytic solution and a subscript s means a value in an active material. A subscript j makes a distinction between a positive electrode and a negative electrode, wherein j equal to 1 means a value in the positive electrode and j equal to 2 means a value in the negative electrode. When the variables or the constants in the positive electrode and the negative electrode are collectively represented, the subscript j is omitted. The denotation of (t) representing a function of time, the denotation of (T) representing battery temperature dependence, the denotation of (θ) representing local SOCθ dependence and the like may be omitted in the present specification. A symbol # attached to the variables or the constants represents an average value.

$$\frac{j_j^{Li}(x, \theta_j, t)}{a_{sj}} = i_{0j}(x, \theta_j, T, t) \cdot \left[ \exp\left(\frac{\alpha_{aj}F}{RT} \cdot \eta_j \#(x, \theta_j, t)\right) - \exp\left(-\frac{\alpha_{cj}F}{RT} \cdot \eta_j \#(x, \theta_j, t)\right) \right] \quad (19)$$

$$\eta_j(x, \theta_j, t) = \phi_{sj}(x, t) - \phi_{ej}(x, t) - U_j(x, \theta_j, t) \quad (20)$$

The above expressions (19) and (20) represent an electrochemical reaction in the electrode (active material) and are called the Butler-Volmer equation.

The following expression (21) holds as an expression relating to the conservation law of lithium ion concentration within the electrolytic solution. A diffusion equation (22) and boundary condition expressions shown in expressions

(23) and (24) are used as expressions relating to the conservation law of lithium ion concentration within the active material. The expression (23) represents a boundary condition at the center of the active material. The expression (24) represents a boundary condition at the interface between the active material and the electrolytic solution (hereinafter also referred to simply as an interface).

A local $SOC\theta_j$ corresponding to local lithium concentration distribution (concentration distribution) at the active material interface is defined by the following expression (25). In the expression (25), $c_{sei}$ represents the lithium concentration at the active material interface in the positive electrode and the negative electrode as shown in the following expression (26), and $c_{sj,max}$ represents the maximum lithium concentration within the active material.

$$\frac{\delta[\varepsilon_{ej} \cdot c_{ej}(x,t)]}{\delta t} = \nabla \cdot [D_{ej}^{eff} \nabla c_{ej}(x,t)] + \frac{1-t_+^0}{F} \cdot j_j^{Li}(x,\theta_l,t) - \frac{i_{ej} \cdot \nabla t_+^0}{F} \quad (21)$$

$$\frac{\partial c_{sj}(x,r_j,t)}{\partial t} = D_{sj}\left[\frac{\partial^2 c_{sj}}{\partial r_j^2} + \frac{2}{r_j}\frac{\partial c_{sj}}{\partial r_j}\right] \quad (22)$$

$$\frac{\partial c_{sj}(x,r_j,t)}{\partial r}\bigg|_{r_j=0} = 0 \quad (23)$$

$$\frac{\partial[\varepsilon_{sj} \cdot c_{sj}(x,r_j,t)]}{\partial t}\bigg|_{r_j=r_{sj}} = -\frac{j_j^{Li}(x,\theta_j,t)}{\alpha_{sj}F} \quad (24)$$

$$\theta_j = \frac{c_{sej}}{c_{sj,max}} \quad (25)$$

$$c_{sej} = c_{sj}(x,r_{sj},t) \quad (26)$$

The following expression (27) holds as an expression relating to the conservation law of charge within the electrolytic solution, and the following expression (28) holds as an expression relating to the conservation law of charge within the active material. The following expression (29) representing the relationship between a current density I(t) and a reaction current density $J_j^{Li}$ holds as an electrochemical reaction expression at the active material interface.

$$\nabla \cdot [k_j^{eff}(x,t)\nabla\phi_{ej}(x,t)] + \nabla \cdot [k_{Dj}^{eff}(x,t)\nabla \ln c_{ej}(x,t)] + j_j^{Li}(x,\theta_j,t) = 0 \quad (27)$$

$$\nabla \cdot [\sigma_j^{eff}(x,t)\nabla\phi_{sj}(x,t)] - j_j^{Li}(x,\theta_j,t) = 0 \quad (28)$$

$$I(t) = \int_0^{L_2} j_2^{Li}(x,\theta_2,t) = -\int_0^{L_1} j_1^{Li}(x,\theta_1,t) \quad (29)$$

The battery model expression represented by the basic equations including the expressions (19) to (29) can be simplified as described below. The simplification of the battery model expression can reduce computing load or shorten a computing time.

It is assumed that a uniform electrochemical reaction is seen in each of a negative electrode 142 and a positive electrode 141. Specifically, it is assumed that the reaction in the x direction uniformly occurs in each of the electrodes 142 and 141. In addition, since it is assumed that uniform reactions occur in a plurality of active materials 142b and 141b included in each of the electrodes 142 and 141, the active materials 142b and 141b in each of the electrodes 142 and 141 are handled as single active material models. Thus, the structure of the secondary battery 1 shown in FIG. 2 can be modeled as a structure shown in FIG. 15.

Figure 15:
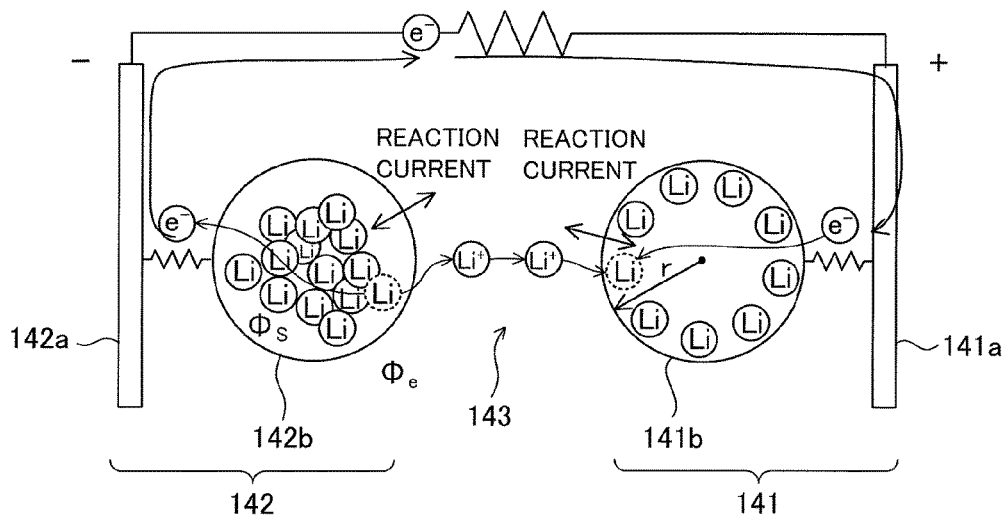
FIG. 15 is a conceptual diagram for explaining a battery model.

In a battery model shown in FIG. 15, it is possible to model an electrode reaction on the surfaces of an active material model 141b (j=1) and an active material model 142b (j=2). In the battery model shown in FIG. 15, it is also possible to model diffusion of lithium within the active material models 141b and 142b (diameter direction) and diffusion of lithium ions within the electrolytic solution (concentration distribution). In addition, potential distribution and temperature distribution can be modeled in each location of the battery model shown in FIG. 15.

Figure 16:
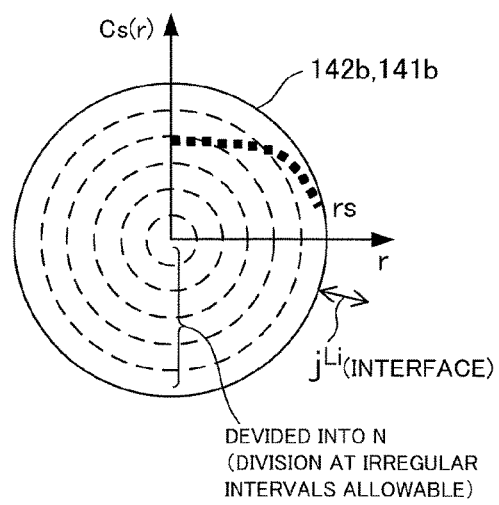
FIG. 16 is a conceptual diagram showing an active material model shown with polar coordinates.

As shown in FIG. 16, a lithium concentration $c_s$ within each of the active material models 141b and 142b can be represented as a function on a coordinate r in a radius direction of the active material models 141b and 142b (r represents a distance from the center of the active material model, $r_s$ represents the radius of the active material). It is assumed that position dependence in a circumferential direction of the active material models 141b and 142b is absent. The active material models 141b and 142b shown in FIG. 16 are used to estimate a lithium diffusion phenomenon within the active material in association with the electrochemical reaction at the interface. Each of the active material models 141b and 142b is divided into N (N is a natural number larger than 2) in the diameter direction, and for each of the N areas (k=1 to N), a lithium concentration $c_{s,k}(t)$ is estimated in accordance with a diffusion equation, later described.

According to the battery model shown in FIG. 15, the basic equations (19) to (24) and (26) can be represented as the following expressions (19') to (24'), and (26'):

$$\frac{j_j^{Li}\#(\theta_j,t)}{a_{sj}} = \quad (19')$$
$$i_{0j}\#(\theta_j,T,t) \cdot \left[\exp\left(\frac{\alpha_{aj}F}{RT}\cdot\eta_j\#(\theta_j,t)\right) - \exp\left(-\frac{\alpha_{cj}F}{RT}\cdot\eta_j\#(\theta_j,t)\right)\right]$$

$$\eta_j\#(\theta_j,t) = \phi_{sj}\#(t) - \phi_{ej}\#(t) - U_j\#(\theta_j,t) \quad (20')$$

$$c_{ej}(t) = const. \quad (21')$$

$$\frac{\partial c_{sj}(r_j,t)}{\partial t} = D_{sj}\left[\frac{\partial^2 c_{sj}}{\partial r_j^2} + \frac{2}{r_j}\frac{\partial c_{sj}}{\partial r_j}\right] \quad (22')$$

$$\frac{\partial c_{sj}(r_j,t)}{\partial r}\bigg|_{r_j=0} = 0 \quad (23')$$

$$\frac{\partial[\varepsilon_{sj} \cdot c_{sj}(r_j,t)]}{\partial t}\bigg|_{r_j=r_{sj}} = -\frac{j_j^{Li}(\theta_j,t)}{\alpha_{sj}F} \quad (24')$$

$$c_{sej} = c_{sj}(r_{sj},t) \quad (26')$$

In the expression (21'), it is assumed that $c_{ej}(t)$ takes a constant value by assuming that the electrolytic solution has a lithium concentration constant over time. For the active material models 141b and 142b, the diffusion equations (22) to (24) are transformed into the diffusion equations (22') to (24') in view of only the distribution in the polar coordinate direction. In the expression (26'), the lithium concentration $c_{sej}$ at the active material interface corresponds to the lithium concentration $c_{si}(t)$ in the outermost area of the N divided areas shown in FIG. 16.

The expression (27) relating to the conservation law of charge within the electrolytic solution is simplified into the following expression (30) by using the expression (21'). Thus, a potential $\varphi_{ej}$ of the electrolytic solution is approximated as a quadric function of x. An average potential $\varphi_{ej}\#$ within the electrolytic solution used for calculation of an overvoltage $\eta_j\#$ is determined from the following expression (31) provided by integrating the expression (30) with an electrode thickness $L_j$.

For the negative electrode 142, the following expression (32) holds on the basis of the expression (30). Thus, a difference (a potential difference) between an electrolytic solution average potential $\varphi_{e2}\#$ and an electrolytic solution potential at the boundary between the negative electrode 142 and the separator 143 is represented by the following expression (33). For the positive electrode 141, a difference (a potential difference) between an electrolytic solution average potential $\varphi_{e1}\#$ and an electrolytic solution potential at the boundary between the positive electrode 141 and the separator 143 is represented by the following expression (34):

$$\nabla \cdot [\kappa_j^{eff}(t)\nabla \phi_{ej}(x,t)] + j_j^{Li}\#(\theta_j, t) = 0 \Leftrightarrow \phi_{ej}(x,t) = -\frac{j_j^{Li}\#(\theta_j, t)}{2\kappa_j^{eff}}x^2 \quad (30)$$

$$\phi_{ej}\#(t) = -\frac{j_j^{Li}\#(\theta_j, t)}{2\kappa_j^{eff}} \frac{1}{L_j} \int_0^{L_j} x^2 dx = -\frac{j_j^{Li}\#(\theta_j, t)}{6\kappa_j^{eff}} \cdot L_j^2 \quad (31)$$

$$\phi_{e2}(L_2, t) = -\frac{j_2^{Li}\#(\theta_2, t)}{2\kappa_2^{eff}}L_2^2 \quad (32)$$

$$\phi_{e2}\#(t) - \phi_{e2}(L_2, t) = \quad (33)$$
$$-\frac{j_2^{Li}\#(\theta_2, t)}{6\kappa_2^{eff}}L_2^2 - \left(-\frac{j_2^{Li}\#(\theta_2, t)}{2\kappa_2^{eff}}L_2^2\right) = \frac{j_2^{Li}\#(\theta_2, t)}{3\kappa_2^{eff}}L_2^2 = \frac{L_2}{3\kappa_2^{eff}}I$$

$$\phi_{e1}\#(t) - \phi_{e1}(L_1, t) = \frac{j_1^{Li}\#(\theta_1, t)}{3\kappa_1^{eff}}L_1^2 = -\frac{L_1}{3\kappa_1^{eff}}I \quad (34)$$

The expression (28) relating to the conservation law of charge within the active material can be simplified into the following expression (35). Thus, a potential $\varphi_{sj}$ of the active material is also approximated as a quadratic function of x. An average potential $\varphi_{sj}\#$ within the active material used for calculation of the overvoltage $\eta_j\#$ is determined from the following expression (36) provided by integrating the expression (35) with the electrode thickness $L_j$. For the positive electrode 141, a difference (a potential difference) between an active material average potential $\varphi_{s1}\#$ and an active material potential at the boundary between the active material model 141*b* and a collector plate 141*a* is represented by the following expression (37). Similarly, for the negative electrode 142, the expression (38) holds:

$$\nabla \cdot [\sigma_j^{eff}\nabla\phi_{sj}(x,j)] - j_j^{Li}\#(\theta_j, t) = 0 \Leftrightarrow \phi_{sj}(x,t) = -\frac{j_j^{Li}\#(\theta_j, t)}{2\sigma_j^{eff}}x^2 \quad (35)$$

$$\phi_{sj}\#(t) = \frac{j_j^{Li}\#(\theta_j, t)}{2\sigma_j^{eff}} \frac{1}{L_j} \int_0^{L_j} x^2 dx \quad (36)$$

$$\phi_{s1}\#(t) - \phi_{s1}(L_1, t) = -\frac{j_1^{Li}\#(\theta_1, t)}{3\sigma_1^{eff}}L_1^2 = \frac{L_1}{3\sigma_1^{eff}}I \quad (37)$$

$$\phi_{s2}\#(t) - \phi_{s2}(L_2, t) = -\frac{j_2^{Li}\#(\theta_2, t)}{3\sigma_2^{eff}}L_2^2 = -\frac{L_2}{3\sigma_2^{eff}}I \quad (38)$$

Figure 17:
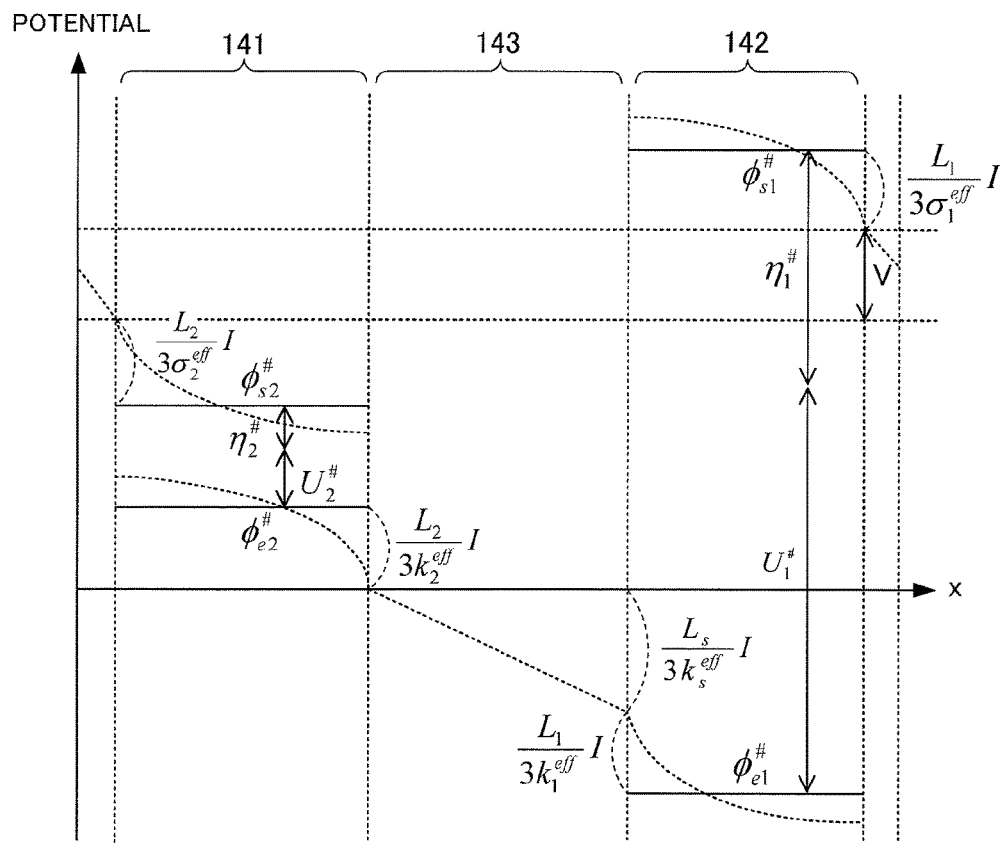
FIG. 17 is a graph showing the relationship between a terminal voltage of the secondary battery and various average potentials.

FIG. 17 shows the relationship between a terminal voltage V(t) of the secondary battery 1 and each average potential determined as described above. In FIG. 17, since the reaction current density $j_j^{Li}$ is zero in the separator 143, a voltage drop in the separator 143 is proportional to the current density I(t) and is represented as $L_s/K_s^{eff}I(t)$.

Since the electrochemical reaction in each electrode is assumed to be uniform, the following expression (39) holds between the current density I(t) per unit area of the electrode plate and the reaction current density (lithium production amount) $J_j^{Li}$:

$$I(t) = -j_1^{Li}(\theta_1, t)L_1 = j_2^{Li}(\theta_2, t)L_2 \quad (39)$$

The following expression (40) holds for a battery voltage V(t) based on the potential relationship shown in FIG. 17 and the above expression (39). The following expression (40) is premised on the potential relationship expression of the following expression (41) shown in FIG. 17.

Next, an average overvoltage $\eta\#(t)$ is calculated. When $j_j^{Li}$ is set to be constant, and $\alpha_{aj}$ and $\alpha_{ej}$ are set to 0.5 with the same charge and discharge efficiency in the Butler-Volmer equation, then the following expression (42) holds. The following expression (42) is inversely transformed to determine the average overvoltage $\eta\#(t)$ from the following expression (43):

$$V(t) = \phi_{s1}\#(t) - \frac{L_1}{3\sigma_1^{eff}}I(t) - \left(\phi_{s2}\#(t) + \frac{L_2}{3\sigma_2^{eff}}I(t)\right) \quad (40)$$

$$\phi_{sj}\#(t) = U_j\#(t) + \phi_{ej}\#(t) + \eta_j\#(t) \quad (41)$$

$$j_j^{Li}\# = a_{sj}i_{0j}(\theta_j, t) \cdot \left[\exp\left(\frac{\alpha_{aj}F}{RT} \cdot \eta_j\#(t)\right) - \exp\left(\frac{\alpha_{ej}F}{RT} \cdot \eta_j\#(t)\right)\right] = \quad (42)$$
$$2a_{sj}i_{0j}(\theta_j, t)\sinh\left(\frac{\alpha_{aj}F}{RT} \cdot \eta_j\#(t)\right)$$

$$\eta_j\#(t) = \frac{RT}{\alpha_{aj}F}\mathrm{arcsinh}\left(\frac{j_j^{Li}\#(\theta_j, t)}{2a_{sj}i_{0j}(\theta_j, t)}\right) \quad (43)$$

Average potentials $\varphi_{s1}$ and $\varphi_{s2}$ are determined with FIG. 17, and the determined values are substituted into the above expression (40). Average overvoltages $\eta_1\#(t)$ and $\eta_2\#(t)$ determined from the above expression (43) are substituted into the above expression (41). As a result, a voltage-current relation model expression (M1a) in accordance with the electrochemical reaction model expression is derived on the basis of the above expressions (19'), (39), and the above expression (20').

An active material diffusion model expression (M2a) for the active material models 141*b* and 142*b* is calculated from the above expression (22') corresponding to the conservation law of lithium concentration (diffusion equation) and the boundary condition expressions (23') and (24'):

$$V(t) = \{U_1\#(\theta_1, t) - U_2\#(\theta_2, t)\} + \frac{RT}{\alpha_{a1}F} \quad (\mathrm{M1a})$$
$$\left\{\mathrm{arcsinh}\left(\frac{-I(t)}{2L_1a_{s1}i_{01}(\theta_1, T, t)}\right) - \mathrm{arcsinh}\left(\frac{I(t)}{2L_2a_{s2}i_{02}(\theta_2, T, t)}\right)\right\} -$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) \quad (\mathrm{M2a})$$

$$\frac{\partial c_{s1}(r_1, t)}{\partial t} = D_{s1}(T)\left[\frac{\partial^2 c_{s1}}{\partial r_1^2} + \frac{2}{r_1}\frac{\partial c_{s1}}{\partial r_1}\right]$$

$$\frac{\partial c_{s2}(r_2, t)}{\partial t} = D_{s2}(T)\left[\frac{\partial^2 c_{s2}}{\partial r_2^2} + \frac{2}{r_2}\frac{\partial c_{s2}}{\partial r_2}\right]$$

The first term of the right side of the model expression (M1a) represents an Open Circuit Voltage (OCV) determined by the concentration of the reaction material (lithium) at the active material surface. The second term of the right side represents the overvoltage ($\eta_1\# - \eta_2\#$). The third term of the right side represents the voltage drop when the current passes through secondary battery 1. Thus, the DC pure resistance of the secondary battery 1 is represented by Rd(T) in the above expression (M2a).

Figure 18:
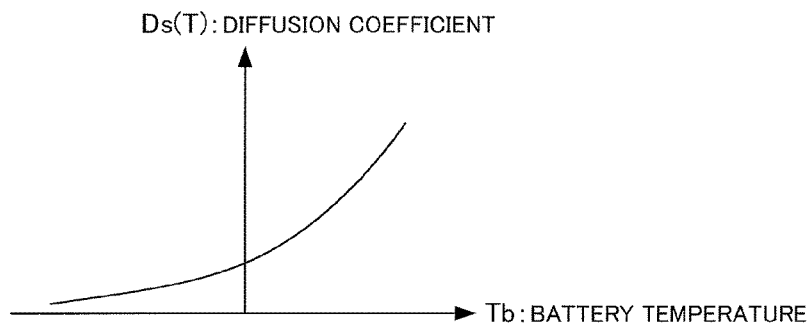
FIG. 18 is a graph for explaining temperature dependence of a diffusion coefficient.

In the expression (M2a), diffusion coefficients $D_{s1}$ and $D_{s2}$ used as parameters for specifying the diffusion speed of the lithium corresponding to the reaction material have temperature dependence. Thus, the diffusion coefficients $D_{s1}$ and $D_{s2}$ can be set, for example by using a map shown in FIG. 18. The map shown in FIG. 18 can be previously obtained. In FIG. 18, a battery temperature Tb on the horizontal axis represents temperatures detected by using a temperature sensor 203. As shown in FIG. 18, the diffusion coefficients $D_{s1}$ and $D_{s2}$ reduce as the battery temperature Tb drops. In other words, the diffusion coefficients $D_{s1}$ and $D_{s2}$ increase as the battery temperature Tb rises.

For the diffusion coefficients $D_{s1}$ and $D_{s2}$, dependence on the local SOCθ may be considered in addition to the dependence on the battery temperature Tb. In this case, preferably, a map representing the correspondence between the battery temperature Tb, the local SOCθ, and the diffusion coefficients $D_{s1}$ and $D_{s2}$ is previously prepared.

Figure 19A:
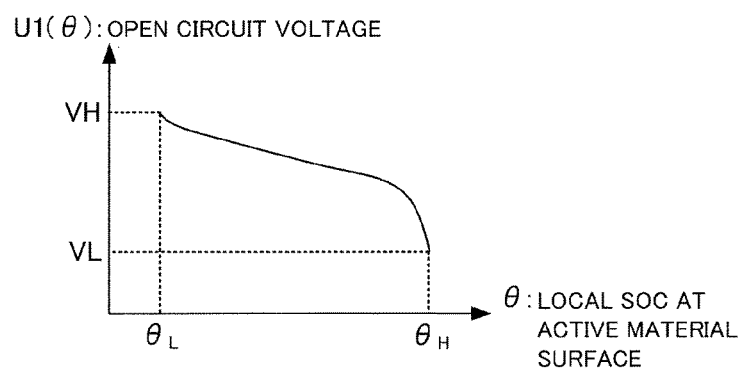
FIG. 19A is a graph showing the relationship between an open circuit voltage (positive electrode) and a local SOC.
Figure 19B:
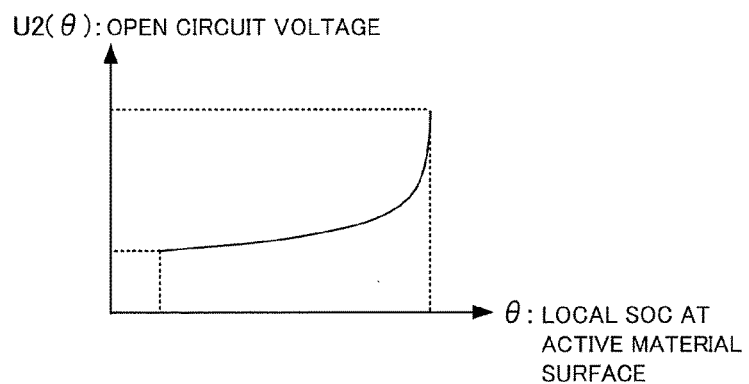
FIG. 19B is a graph showing the relationship between an open circuit voltage (negative electrode) and the local SOC.

As shown in FIG. 19A, the open circuit voltage U1 included in the above expression (M1a) reduces as the local SOCθ increases. As shown in FIG. 19B, the open circuit voltage U2 increases as the local SOCθ increases. When the maps shown in FIG. 19A and FIG. 19B are previously prepared, the open circuit voltage U1 and U2 corresponding to the local SOCθ can be specified.

Exchange current densities $i_{o1}$ and $i_{o2}$ included in the above expression (M1a) have dependence on the local SOCθ and the battery temperature Tb. When a map representing the correspondence between the exchange current densities $i_{o1}$ and $i_{o2}$, the local SOCθ, and the battery temperature Tb is previously prepared, the exchange current densities $i_{o1}$ and $i_{o2}$ can be specified from the local SOCθ and the battery temperature Tb.

A DC pure resistance Rd has dependence on temperature Tb. When a map representing the correspondence between the DC pure resistance Rd and the battery temperature Tb is previously prepared, the DC pure resistance Rd can be specified from the battery temperature Tb. The abovementioned maps can be formed on the basis of the results of experiments such as well-known AC impedance measurements for the secondary battery 1.

The battery model shown in FIG. 15 can be further simplified. Specifically, a common active material model can be used as the active materials in the electrodes 142 and 141. The active material models 141b and 142b shown in FIG. 15 can be handled as the single active material model to perform the replacement of the expression as shown in the following expression (44). In the following expression (44), the subscript j indicating a distinction between the positive electrode 141 and the negative electrode 142 is omitted:

$$\left. \begin{array}{l} U(\theta, t) = U_1\#(\theta_1, t) - U_2\#(\theta_2, t) \\ i_{0j}(\theta_j, T, t) = i_0(\theta, T, t) \\ c_{sj}(r_j, t) = c_s(r, t) \\ D_{sj} = D_s \\ a_{sj} = a_s \\ L_j = L \\ \alpha_{sj} = \alpha_s \\ \theta_j = \theta_1 \end{array} \right\} \quad (44)$$

The model expressions (M1a) and (M2a) can be represented by the following expressions (M1b) and (M2b), respectively. For the battery model using the single active material model, the following expression (39') is used instead of the above expression (39) as a relationship expression of the current density I(t) and the reaction current density $j_1^{Li}$:

$$V(t) = U(\theta, t) + \frac{RT}{\alpha_a F}\mathrm{arcsinh}\left(\frac{-I(t)}{2La_s i_0(\theta, T, t)}\right) - \quad (M1b)$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$\frac{\partial c_s(r, t)}{\partial t} = D_s(T)\left[\frac{\partial^2 c_s}{\partial r^2} + \frac{2}{r}\frac{\partial c_s}{\partial r}\right] \quad (M2b)$$

$$I(t) = -L \cdot j^{Li}\#(\theta, t) \quad (39')$$

An arcsinh term in the above expression (M1a) can be linearly approximated to provide the following expression (M1c). The linear approximation can reduce the computing load and shorten the computing time.

$$V(t) = \{U_1\#(\theta_1, t) - U_2\#(\theta_2, t)\} + \quad (M1c)$$

$$\frac{RT}{\alpha_{a1} F}\frac{-I(t)}{2L_1 a_{s1} i_{01}(\theta_1, T, t)} - \frac{RT}{\alpha_{a1} F}\frac{I(t)}{2L_2 a_{s2} i_{02}(\theta_2, T, t)} -$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rr(\theta_1, \theta_2, T) = \frac{RT}{2\alpha_{a1} F}\left\{\frac{1}{L_1 a_{s1} i_{01}(\theta_1, T)} + \frac{2}{L_2 a_{s2} i_{02}(\theta_2, T)}\right\} \quad (45)$$

$$V(t) = \{U_1\#(\theta_1, t) - U_2\#(\theta_2, t)\} + Rr(\theta_1, \theta_2, T)I(t) - Rd(T) \cdot I(t) \quad (46)$$

In the above expression (M1c), the second term of the right side is represented by the product of the current density I(t) and a reaction resistance Rr as a result of the linear approximation. As shown in the above expression (45), the reaction resistance Rr is calculated from the exchange current densities $i_{o1}$ and $i_{o2}$ dependent on the local SOCθ and the battery temperature Tb. Thus, when the above expression (M1c) is used, a map representing the correspondence between the local SOCθ, the battery temperature Tb, and the exchange current densities $i_{o1}$ and $i_{o2}$ may be previously prepared. According to the above expression (M1c) and the above expression (45), the above expression (46) is obtained.

An arcsinh term corresponding to the second term of the right side in the above expression (M1b) can be linearly approximated to provide the following expression (M1d):

$$V(t) = U(\theta, t) + \frac{RT}{\alpha_a F} \frac{-I(t)}{2L_1 a_s i_0(\theta, t)} -$$

$$I(t)\left(\frac{L_1}{3\kappa_1^{\text{eff}}} + \frac{L_s}{3\kappa_s^{\text{eff}}} + \frac{L_2}{3\kappa_2^{\text{eff}}} + \frac{L_1}{3\sigma_1^{\text{eff}}} + \frac{L_2}{3\sigma_2^{\text{eff}}}\right)$$

$$- Rr(\theta, t) \cdot I(t) = \frac{RT}{\alpha_a F} \frac{-I(t)}{2L_1 a_s i_0(\theta, t)}$$

$$Rd(T) = \left(\frac{L_1}{3\kappa_1^{\text{eff}}} + \frac{L_s}{3\kappa_s^{\text{eff}}} + \frac{L_2}{3\kappa_2^{\text{eff}}} + \frac{L_1}{3\sigma_1^{\text{eff}}} + \frac{L_2}{3\sigma_2^{\text{eff}}}\right)$$

Figure 20:
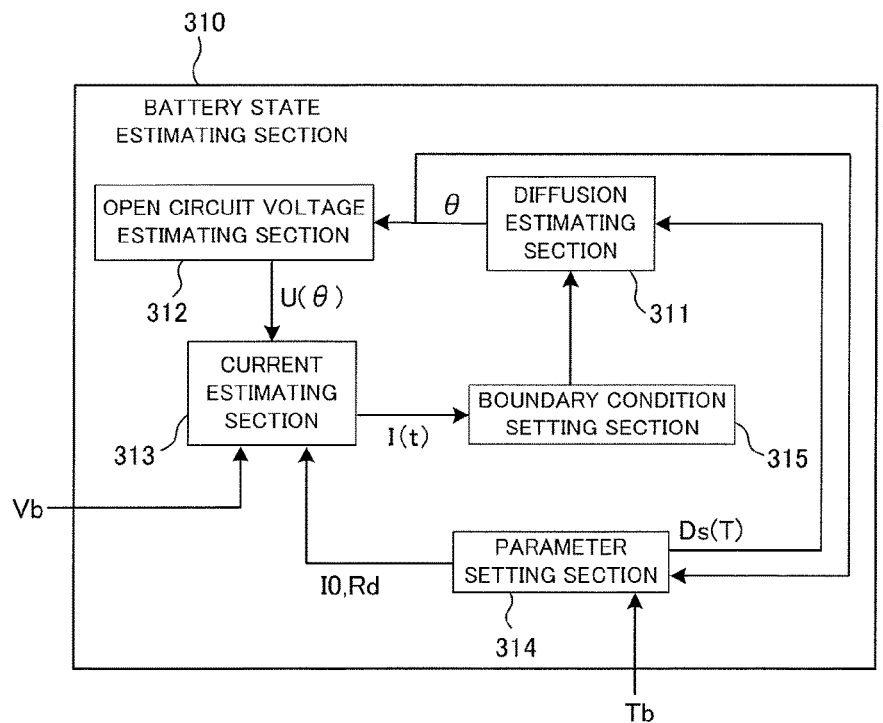
FIG. 20 is a schematic diagram showing the configuration of a battery state estimating section provided in a controller.

Next, description is made of the configuration for estimating the state of the secondary battery 1 by using the above battery model expression. FIG. 20 is a schematic diagram showing the internal configuration of a controller 300. A battery state estimating section 310 includes a diffusion estimating section 311, an open circuit voltage estimating section 312, a current estimating section 313, a parameter setting section 314, and a boundary condition setting section 315. In the configuration shown in FIG. 20, the battery state estimating section 310 uses the above expression (M1d) and the above expression (M2b) to calculate the current density I(t).

Although the current density I(t) is calculated by using the above expression (M1d) in the present embodiment, the present invention is not limited thereto. Specifically, the current density I(t) can be calculated on the basis of an arbitrary combination of any of the above expressions (M1a) to (M1d) with the above expression (M2a) or (M2b).

The diffusion estimating section 311 uses the above expression (M2b) to calculate the lithium concentration distribution within the active material based on the boundary condition set in the boundary condition setting section 315. The boundary condition is set on the basis of the above expression (23') or the above expression (24'). The diffusion estimating section 311 uses the above expression (25) to calculate the local SOCθ based on the calculated lithium concentration distribution. The diffusion estimating section 311 outputs information about the local SOCθ to the open circuit voltage estimating section 312.

The open circuit voltage estimating section 312 specifies the open circuit voltages U1 and U2 of the electrodes 141 and 142, respectively, based on the local SOCθ calculated by the diffusion estimating section 311. Specifically, the open circuit voltage estimating section 312 can use the maps shown in FIG. 19A and FIG. 19B to specify the open circuit voltages U1 and U2. The open circuit voltage estimating section 312 can calculate the open circuit voltage of the secondary battery 1 based on the open circuit voltages U1 and U2. The open circuit voltage of the secondary battery 1 is provided by subtracting the open circuit voltage U2 from the open circuit voltage U1.

The parameter setting section 314 sets parameters used in the battery model expression in accordance with the battery temperature Tb and the local SOCθ. The temperature Tb detected by the temperature sensor 203 is used as the battery temperature Tb. The local SOCθ is obtained from the diffusion estimating section 311. The parameters set by the parameter setting section 314 include a diffusion constant $D_s$ in the above expression (M2b), and the current density $i_0$ and the DC resistance Rd in the above expression (M1f).

The current estimating section 313 uses the following expression (M3a) to calculate (estimate) the current density I(t). The following expression (M3a) is provided by transforming the above expression (M1d). In the following expression (M3a), an open circuit voltage U(θ, t) corresponds to an open circuit voltage U(θ) estimated in the open circuit voltage estimating section 312. A voltage V(t) corresponds to the battery voltage Vb obtained by a monitor unit 201. Rd(t) and $i_0(\theta, T, t)$ are values set in the parameter setting section 314.

$$I(t) = \frac{U(\theta, t) - V(t)}{Rd(T) + \frac{RT}{\alpha_a F 2 L a_s i_0(\theta, T, t)}}$$

(M3a)

When any of the above expressions (M1a) to (M1d) is used, the current density I(t) can also be calculated in the same manner as that for the expression (M3a) described above.

The boundary condition setting section 315 uses the above expression (39) or the above expression (39') to calculate the reaction current density (lithium production amount) $j_j^{Li}$ from the current density I(t) calculated by the current estimating section 313. The boundary condition setting section 315 uses the above expression (24') to update the boundary condition in the above expression (M2b). Once the boundary condition is updated, the lithium concentration distribution in the active material model can be calculated on the basis of the expressions (M2a) and (M2b).

Once the lithium concentration distribution in the active material model is calculated, the lithium average concentration $c_{save}$ can be calculated on the basis of the following expression (47):

$$c_{save}(t) = \sum_{k=1}^{N} c_{sj,k}(t) \cdot \frac{\Delta V_k}{V}$$

(47)

The lithium concentration $c_{sj,k}(t)$ (k=1 to N) shown in the expression (47) represents the lithium concentration in each area provided by dividing the active material models 141b and 142b into N in the diameter direction as shown in FIG. 16, and is estimated by the diffusion model expressions (M2a) and (M2b). ΔVk represents the volume of each divided area, and V represents the volume of the whole active material. When the active material model common to the positive electrode and the negative electrode is used, the average value of the lithium concentration $c_{s,k}(t)$ (k=1 to N) of each area in the common active material model can be calculated as in the expression (47) to determine the lithium average concentration $c_{save}(t)$.

Figure 21:
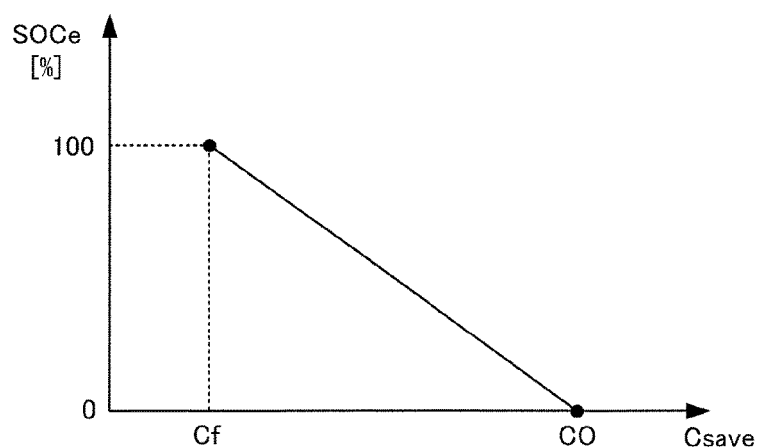
FIG. 21 is a graph showing the relationship between an SOC and a lithium average concentration.

FIG. 21 shows the relationship between the lithium average concentration $c_{save}$ in the positive electrode active material and the SOCe. As shown in FIG. 21, as the lithium average concentration $c_{save}$ in the positive electrode active material increases, the SOC reduces. In other words, the lithium average concentration $c_{save}$ in the positive electrode active material reduces, the SOC increases. In this case, a lithium average concentration Cf when the SOC is at 100% and a lithium average concentration C0 when the SOC is at 0% can be previously determined.

Linear interpolation can be performed to specify the relationship between the lithium average concentration $c_{save}$ and the SOCe as shown in FIG. 21. When the lithium average concentration $c_{save}$ is calculated, the SOCe corresponding to that lithium average concentration $c_{save}$ can be specified with the relationship shown in FIG. 21. Specifically, the SOCe of the secondary battery 1 can be calculated on the basis of the following expression (48):

$$SOCe = \frac{C0 - c_{save}(t)}{C0 - Cf} \times 100 \tag{48}$$

The secondary battery 1 experiences a voltage drop due to a concentration overvoltage. The concentration overvoltage is caused by nonuniform concentration distribution (concentration gradient) in the electrolytic solution located between the positive electrode 141 and the negative electrode 142. When the voltage drop due to the concentration overvoltage is factored in, the expressions (M1a) to (M1d) can be replaced with the following expressions (M1a') to (M1d'):

$$V(t) = \tag{M1a'}$$
$$\{U_1\#(\theta_1, t) - U_2\#(\theta_2, t)\} + \frac{RT}{\alpha_{a1} F}\left\{\text{arcsinh}\left(\frac{-I(t)}{2L_1 a_{s1} i_{01}(\theta_1, T, t)}\right) - \right.$$
$$\left. \text{arcsinh}\left(\frac{I(t)}{2L_2 a_{s2} i_{02}(\theta_2, T, t)}\right)\right\} -$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) + \Delta\phi_e$$

$$V(t) = U(\theta, t) + \frac{RT}{\alpha_a F}\text{arcsinh}\left(\frac{-I(t)}{2La_s i_0(\theta, T, t)}\right) - \tag{M1b'}$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) + \Delta\phi_e$$

$$V(t) = \{U_1\#(\theta_1, t) - U_2\#(\theta_2, t)\} + \tag{M1c'}$$
$$\frac{RT}{\alpha_{a1} F}\frac{-I(t)}{2L_1 a_{s1} i_{01}(\theta_1, T, t)} - \frac{RT}{\alpha_{a1} F}\frac{I(t)}{2L_2 a_{s2} i_{02}(\theta_2, T, t)} -$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) + \Delta\phi_e$$

$$V(t) = U(\theta, t) + \frac{RT}{\alpha_a F}\frac{-I(t)}{2L_1 a_s i_0(\theta, t)} - \tag{M1d'}$$
$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right) + \Delta\phi_e$$

The expression (M3a) can be replaced with the following expression (M3a'):

$$I(t) = \frac{U(\theta, t) - V(t) + \Delta\phi_e}{Rd(T) + \frac{RT}{\alpha_a F 2 L a_s i_0(\theta_1, T, t)}} \tag{M3a'}$$

The concentration overvoltage $\Delta\phi_e$ mentioned above can be represented by the following expression (49):

$$\frac{\partial}{\partial x}\left(\kappa^{eff}\frac{\partial \phi_e}{\partial x}\right) + \frac{\partial}{\partial x}\left(\kappa_D^{eff}\frac{\partial \ln c_e}{\partial x}\right) + j_j^{Li}(x, \theta_j, t) = 0 \tag{49}$$

The expression (49) can be transformed into the following expression (50). From the expression (50), the following expression (51) can be derived:

$$\frac{1}{\Delta x}\left(\kappa^{eff}\frac{\Delta \phi_e}{\Delta x} + \kappa_D^{eff}\frac{\Delta \ln c_e}{\Delta x}\right) = 0 \tag{50}$$

$$\kappa^{eff}\Delta\phi_e + \kappa_D^{eff}\Delta\ln c_e = 0 \tag{51}$$

From the expression (51), the following expression (52) can be derived:

$$\Delta\phi_e = -k\Delta\ln c_e \tag{52}$$
$$k = \frac{2RT}{F}(t_+^0 - 1)$$

The expression (52) can be transformed as shown in the following expression (53):

$$\Delta\overline{\phi_e} = -k\Delta\ln\overline{c_e} = -k\ln\frac{\overline{c_{e1}}}{\overline{c_{e2}}} = -k\ln\frac{c_e - \Delta\overline{c_e}}{c_e + \Delta\overline{c_e}} \tag{53}$$

The expression (53) can be transformed as shown in the following expression (54) by linear approximation:

$$\Delta\overline{\phi_e} = -k\ln\frac{c_e - \Delta\overline{c_e}}{c_e + \Delta\overline{c_e}} = -k\ln\frac{1 - \frac{\Delta\overline{c_e}}{c_e}}{1 + \frac{\Delta\overline{c_e}}{c_e}} \tag{54}$$
$$= -k\left\{\ln\left(1 - \frac{\Delta\overline{c_e}}{c_e}\right) - \ln\left(1 + \frac{\Delta\overline{c_e}}{c_e}\right)\right\} \approx 2k\frac{\Delta\overline{c_e}}{c_e}$$

$\Delta C_e$ shown in the expressions (53) and (54) correspond to the ion concentration imbalance dCe(t) described in Embodiment 1. The ion concentration imbalance dCe(t) is calculated as described in Embodiment 1, and then the value of the ion concentration imbalance dCe(t) can be substituted into $\Delta C_e$ shown in the expressions (53) and (54).

$C_e$ shown in the expressions (53) and (54) correspond to the average ion concentration $Ce_{ave}(t)$ described in Embodiment 1. The average ion concentration $Ce_{ave}(t)$ is calculated as described in Embodiment 1, and then the value of the average ion concentration $Ce_{ave}(t)$ can be substituted into $C_e$ shown in the expressions (53) and (54). In this manner, the concentration overvoltage $\Delta\phi_e$ can be calculated on the basis of the expressions (53) and (54).

As described in Embodiment 1, the ion concentration imbalance dCe(t) and the average ion concentration $Ce_{ave}(t)$ are updated once in the cycle time $\Delta t$. When the concentration overvoltage $\Delta\phi_e$ is calculated on the basis of the ion concentration imbalance dCe(t) and the average ion concentration $Ce_{ave}(t)$, the concentration overvoltage $\Delta\phi_e$ can be estimated accurately in the secondary battery 1 at the present time.

Since the concentration overvoltage $\Delta\phi_e$ can be estimated accurately, the expressions (M1a') to (M1d') and (M3a') can be used to calculate the current density I(t) with the concentration overvoltage $\Delta\phi_e$ factored in. As described above, the boundary condition in the expression (M2b) is updated to calculate the lithium concentration distribution in the active material model to allow the calculation of the lithium average concentration $c_{save}$. Then, the SOC of the secondary battery 1 can be calculated from the lithium average concentration $c_{save}$. Since the SOC of the secondary battery 1 is calculated in this manner, the accurate estimation of the concentration overvoltage $\Delta\varphi_e$ can also improve the estimation accuracy of the SOC.

Next, the processing of calculating the SOC of the secondary battery 1 is described with reference to a flow chart shown in FIG. 22. The processing shown in FIG. 22 is performed each time the cycle time $\Delta t$ elapses, and is performed by the controller 300 (including the battery state estimating section 310).

At step S701, the controller 300 (battery state estimating section 310) detects the voltage (battery voltage) Vb of the secondary battery 1 based on the output from the monitor unit 201. At step S702, the controller 300 (battery state estimating section 310) detects the temperature (battery temperature) Tb of the secondary battery 1 based on the output from the temperature sensor 203.

At step S703, the controller 300 (diffusion estimating section 311) calculates the local SOCθ based on the lithium concentration distribution in the previous computing with the above expression (M2b). At step S704, the controller 300 (open circuit voltage estimating section 312) calculates the open circuit voltage U(θ) from the local SOCθ calculated in the processing at step S703.

At step S705, the controller 300 calculates the concentration overvoltage $\Delta\varphi_e$ based on the expression (53) or the expression (54). For calculating the concentration overvoltage $\Delta\varphi_e$, the ion concentration imbalance dCe(t) and the average ion concentration $Ce_{ave}(t)$ are calculated as described in Embodiment 1 in advance. The ion concentration imbalance dCe(t) is calculated with the processing described in FIG. 6. The average ion concentration $Ce_{ave}(t)$ is calculated with the processing described in FIG. 8.

At step S706, the controller 300 (current estimating section 313) calculates (estimates) a current density Im(t) with the above expressions (M1a') to (M1d') and (M3a'). The current density Im(t) is calculated, for example, by substituting the battery voltage Vb, the open circuit voltage U(θ) calculated in the processing at step S704, the concentration overvoltage $\Delta\varphi_e$ calculated in the processing at step S705, and the parameter values set in the parameter setting section 314 into the above expression (M3a').

At step S707, the controller 300 (boundary condition setting section 315) calculates the reaction current density (lithium production amount) $j_j^{Li}$ from the current density I(t) calculated in the processing at step S706. The controller 300 (boundary condition setting section 315) also uses the calculated reaction current density to set the boundary condition (active material interface) at the active material interface in the above expression (M2b).

At step S708, the controller 300 (diffusion estimating section 311) uses the above expression (M2b) to calculate the lithium concentration distribution within the active material model and updates the estimated value of the lithium concentration in each area. The lithium concentration (updated value) in the outermost divided area is used for calculating the local SOCθ in the processing at step S703 next time the processing shown in FIG. 22 is performed.

At step S709, the controller 300 calculates the lithium average concentration $c_{save}$ within the positive electrode active material. As described above, the lithium average concentration $c_{save}$ is calculated from the lithium concentration distribution calculated in the processing at step S708. At step S710, the controller 300 calculates the SOC of the secondary battery 1. Specifically, the controller 300 uses the correspondence shown in FIG. 21 to calculate the SOCe corresponding to the lithium average concentration $c_{save}$ calculated in the processing at step S709.

Although the processing shown in FIG. 22 includes calculating the ion concentration imbalance dCe(t) and the average ion concentration Ce(t) each time the cycle time $\Delta t$ elapses, the present invention is not limited thereto. As described in Embodiment 1, the average ion concentration $Ce_{ave}(t)$ may change over a longer term than the ion concentration imbalance dCe(t) does.

In this case, the average ion concentration $Ce_{ave}(t)$ can be a fixed value in a predetermined time period longer than the cycle time $\Delta t$. Specifically, the average ion concentration $Ce_{ave}(t)$ used in the predetermined time period can be provided by using the average ion concentration $Ce_{ave}(t)$ calculated immediately before the measurement of the predetermined time period is started. The predetermined time period may be a time period from the start of the running to the end of the running of the vehicle, for example.

The invention claimed is:

1. A battery system comprising:
   a chargeable and dischargeable secondary battery; and
   a controller configured to estimate a deterioration state or a charge state of the secondary battery,
   wherein the controller estimates the deterioration state or the charge state based on an average ion concentration in an electrolyte, and not based on an ion concentration in a positive electrode and a negative electrode, the average ion concentration being changed in accordance with an electric current flowing through the secondary battery,
   wherein the electrolyte is provided between and separate from the positive electrode and the negative electrode.

2. The battery system according to claim 1, wherein the controller is configured to:
   detect a surface pressure of the secondary battery with a pressure sensor; and
   calculate the average ion concentration with a computing expression including the surface pressure as a variable.

3. The battery system according to claim 1, wherein the controller is configured to:
   estimate a surface pressure of the secondary battery from an electric current flowing through the secondary battery; and
   calculate the average ion concentration with a computing expression including the surface pressure as a variable.

4. The battery system according to claim 1, wherein the controller is configured to:
   calculate an ion concentration imbalance between the positive electrode and the negative electrode, the ion concentration imbalance being changed in accordance with an electric current flowing through the secondary battery; and
   estimates the deterioration state or the charge state based on the average ion concentration and the ion concentration imbalance.

5. The battery system according to claim 4, further comprising a current sensor configured to detect the electric current flowing through the secondary battery,
   wherein the controller is configured to substitute a value detected by the current sensor into a computing expression including a current value as a variable to calculate the ion concentration imbalance.

6. The battery system according to claim 1, wherein the controller is configured to:
   calculate an ion concentration imbalance in a plane in which the positive electrode and the negative electrode are opposite to each other, the ion concentration imbalance being changed in accordance with an electric current flowing through the secondary battery; and estimate the deterioration state based on the average ion concentration and the ion concentration imbalance.

7. The battery system according to claim 6, wherein the controller is configured to:
   detect a surface pressure of the secondary battery with a pressure sensor; and
   calculate the ion concentration imbalance with a computing expression including the surface pressure as a variable.

8. The battery system according to claim 6, wherein the controller is configured to:
   estimate a surface pressure of the secondary battery from an electric current flowing through the secondary battery; and
   calculate the ion concentration imbalance with a computing expression including the surface pressure as a variable.

9. The battery system according to claim 1, wherein the controller is configured to:
   calculate a first ion concentration imbalance between the positive electrode and the negative electrode, the first ion concentration imbalance being changed in accordance with an electric current flowing through the secondary battery;
   calculate a second ion concentration imbalance in a plane in which the positive electrode and the negative electrode are opposite to each other, the second ion concentration imbalance being changed in accordance with an electric current flowing through the secondary battery; and
   estimates the deterioration state based on the average ion concentration, the first ion concentration imbalance, and the second ion concentration imbalance.

10. The battery system according to claim 9, wherein the controller is configured to:
    detect a surface pressure of the secondary battery with a pressure sensor or estimate the surface pressure from an electric current flowing through the secondary battery; and
    calculate the first ion concentration imbalance and the second ion concentration imbalance with a computing expression including the surface pressure as a variable.

11. The battery system according to claim 1, wherein the controller is configured to limit an output from or an input to the secondary battery when the deterioration state is estimated and a parameter specifying the estimated deterioration state is larger than a threshold value.

12. The battery system according to claim 1, wherein the controller is configured to:
    calculate an average ion concentration in the active material based on an ion concentration distribution in an active material of the secondary battery; and
    determine a charge state corresponding to the calculated average ion concentration in the active material by using a correspondence between the average ion concentration in the active material and a charge state.

13. The battery system according to claim 12, further comprising a voltage sensor configured to detect a voltage of the secondary battery,
    wherein the controller is configured to:
    calculate the ion concentration distribution in the active material with a diffusion equation, a boundary condition at an interface of the active material being set in the diffusion equation;
    set the boundary condition in a battery model expression based on a current density calculated from a value detected by the voltage sensor and a concentration overvoltage; and
    calculate the concentration overvoltage based on the average ion concentration between the positive electrode and the negative electrode and the ion concentration imbalance between the positive electrode and the negative electrode.

* * * * *